United States Patent
Kim et al.

(10) Patent No.: US 12,419,086 B2
(45) Date of Patent: Sep. 16, 2025

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Geunwoo Kim, Suwon-si (KR); Wandon Kim, Suwon-si (KR); Hyunwoo Kang, Suwon-si (KR); Hyunbae Lee, Suwon-si (KR); Jeonghyuk Yim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 427 days.

(21) Appl. No.: 18/130,732

(22) Filed: Apr. 4, 2023

(65) Prior Publication Data

US 2024/0113163 A1   Apr. 4, 2024

(30) Foreign Application Priority Data

Sep. 30, 2022   (KR) ........................ 10-2022-0125572

(51) Int. Cl.
| | |
|---|---|
| *H01L 29/06* | (2006.01) |
| *H01L 27/092* | (2006.01) |
| *H01L 29/423* | (2006.01) |
| *H01L 29/66* | (2006.01) |
| *H01L 29/775* | (2006.01) |

(Continued)

(52) U.S. Cl.
CPC .......... *H10D 62/121* (2025.01); *H10D 30/43* (2025.01); *H10D 30/6735* (2025.01); *H10D 30/6757* (2025.01); *H10D 64/021* (2025.01); *H10D 84/85* (2025.01)

(58) Field of Classification Search
CPC .... H10D 30/014; H10D 30/024; H10D 30/43; H10D 30/62; H10D 30/6211; H10D 30/6212; H10D 30/6213; H10D 30/6219; H10D 30/6713; H10D 30/6735; H10D 30/6757; H10D 30/797; H10D 62/021; H10D 62/118; H10D 62/119; H10D 62/121; H10D 62/149; H10D 62/151; H10D 84/013; H10D 84/0158; H10D 84/017;

(Continued)

(56) References Cited

U.S. PATENT DOCUMENTS

| | | |
|---|---|---|
| 7,696,086 B2 | 4/2010 | Hsu et al. |
| 7,727,880 B1 | 6/2010 | Chattopadhyay et al. |

(Continued)

FOREIGN PATENT DOCUMENTS

KR   10-1994-0022708 A   10/1994

*Primary Examiner* — David C Spalla
(74) *Attorney, Agent, or Firm* — Fish & Richardson P.C.

(57) ABSTRACT

A semiconductor device includes; a substrate including an active pattern, a channel pattern and a source/drain pattern on the active pattern, wherein the channel pattern is connected to the source/drain pattern, a gate electrode on the channel pattern, and a gate contact connected to a top surface of the gate electrode, wherein the gate contact includes a capping layer directly contacting the top surface of the gate electrode and a metal layer on the capping layer, wherein the capping layer and the metal layer include the same metal, a concentration of oxygen in the metal layer ranges from between about 2 at % to about 10 at %, and a maximum concentration of oxygen in the capping layer ranges from between about 15 at % to about 30 at %.

20 Claims, 47 Drawing Sheets

(51) Int. Cl.

| | |
|---|---|
| *H01L 29/786* | (2006.01) |
| *H10D 30/43* | (2025.01) |
| *H10D 30/67* | (2025.01) |
| *H10D 62/10* | (2025.01) |
| *H10D 64/01* | (2025.01) |
| *H10D 84/85* | (2025.01) |

(58) Field of Classification Search
CPC .. H10D 84/0193; H10D 84/834; H10D 84/85; H10D 84/853
See application file for complete search history.

(56) References Cited

U.S. PATENT DOCUMENTS

| | | |
|---|---|---|
| 10,755,945 B2 | 8/2020 | Chang et al. |
| 10,818,768 B1 | 10/2020 | Cheng et al. |
| 10,854,506 B2 | 12/2020 | Liang et al. |
| 10,923,393 B2 | 2/2021 | Cheng et al. |
| 11,251,078 B2 | 2/2022 | Cheng et al. |
| 11,631,769 B2 * | 4/2023 | Kim ................ H01L 23/53266 |
| | | 257/288 |
| 12,176,435 B2 * | 12/2024 | Wang ................ H10D 30/6211 |
| 2021/0098364 A1 * | 4/2021 | Yu ........................ H10D 84/834 |
| 2022/0102199 A1 * | 3/2022 | Hsiung ............. H01L 21/76897 |
| 2022/0367263 A1 * | 11/2022 | Wu ................... H01L 23/53266 |

* cited by examiner

SEMICONDUCTOR DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2022-0125572 filed on Sep. 30, 2022 in the Korean Intellectual Property Office, the subject matter of which is hereby incorporated by reference in its entirety.

BACKGROUND

The inventive concept relates to semiconductor devices and methods of fabricating same. More particularly, the inventive concept relates to semiconductor devices including at least one field effect transistor (FET) and method of fabricating same.

Semiconductor devices routinely include integrated circuit(s) including metal oxide semiconductor field effect transistors (MOSFETs). As the respective physical size of semiconductor device has decreased, and as design rules defining semiconductor devices have correspondingly decrease, the size of constituent MOSFETs has been increasingly scaled down. Unfortunately, the ongoing scale down of MOSFETs tends to deteriorate various operating characteristics of the semiconductor devices. Accordingly, assorted studies have been conducted to develop methods of fabricating semiconductor devices exhibiting superior performances while overcoming limitations inherent in the dense integration of elements and components of the semiconductor devices.

SUMMARY

Some embodiments of the inventive concept provide semiconductor devices exhibiting improved electrical properties. Other embodiments of the inventive concept provide methods of fabricating semiconductor devices exhibiting improved electrical properties.

According to some embodiments of the inventive concept, a semiconductor device may include; a substrate including an active pattern, a channel pattern and a source/drain pattern on the active pattern, wherein the channel pattern is connected to the source/drain pattern, a gate electrode on the channel pattern; and a gate contact connected to a top surface of the gate electrode, wherein the gate contact includes a capping layer directly contacting the top surface of the gate electrode and a metal layer on the capping layer, wherein the capping layer and the metal layer include the same metal, a concentration of oxygen in the metal layer ranges from between about 2 at % to about 10 at %, and a maximum concentration of oxygen in the capping layer ranges from between about 15 at % to about 30 at %.

According to some embodiments of the inventive concept. a semiconductor device may include; a substrate including an active pattern, a channel pattern and a source/drain pattern on the active pattern, wherein the channel pattern is connected to the source/drain pattern, a gate electrode on the channel pattern, and a gate contact connected to a top surface of the gate electrode, wherein a concentration of oxygen at an interface between the gate contact and the gate electrode ranges from between about 15 at % to about 30 at %, and an average grain size of the gate contact ranges from between about 100 Å to about 500 Å.

According to some embodiments of the inventive concept, a semiconductor device may include; a substrate including a PMOSFET region and an NMOSFET region, a first active pattern on the PMOSFET region and a second active pattern on the NMOSFET region, a first channel pattern and a first source/drain pattern on the first active pattern, a second channel pattern and a second source/drain pattern on the second active pattern, a gate electrode on the first channel pattern and the second channel pattern, a gate dielectric layer between the gate electrode and the first channel pattern and the second channel pattern, a gate spacer on a sidewall of the gate electrode, a gate capping pattern on a top surface of the gate electrode, a gate cutting pattern that penetrates the gate electrode, an interlayer dielectric layer on the gate capping pattern and the gate cutting pattern, a gate contact that penetrates the interlayer dielectric layer and the gate capping pattern and is connected to the top surface of the gate electrode, a first metal layer on the interlayer dielectric layer, the first metal layer including a power line that vertically overlaps the gate cutting pattern and a first wiring line connected to the gate contact; and a second metal layer on the first metal layer, wherein the second metal layer includes second wiring lines electrically connected to the first metal layer, the gate contact includes molybdenum, and an average grain size of the molybdenum in the gate contact ranges from between about 100 Å to about 500 Å.

According to some embodiments of the inventive concept, a method of fabricating a semiconductor device may include; forming an active pattern on a substrate, forming a sacrificial pattern on the active pattern, forming a source/drain pattern on one side of the sacrificial pattern, forming an interlayer dielectric layer that covers the sacrificial pattern and the source/drain pattern, replacing the sacrificial pattern with a gate electrode, forming a contact hole that penetrates the interlayer dielectric layer and exposes a top surface of the gate electrode, using a first metal precursor devoid of an oxygen atom to form a capping layer in the contact hole, and using a second metal precursor including an oxygen atom to form a metal layer on the capping layer.

BRIEF DESCRIPTION OF THE DRAWINGS

Advantages, benefits, and features, as well as the making and use of the inventive concept may be better understood upon consideration of the following detailed description together with the accompanying drawings, in which.

DETAIL DESCRIPTION

Figure 1:
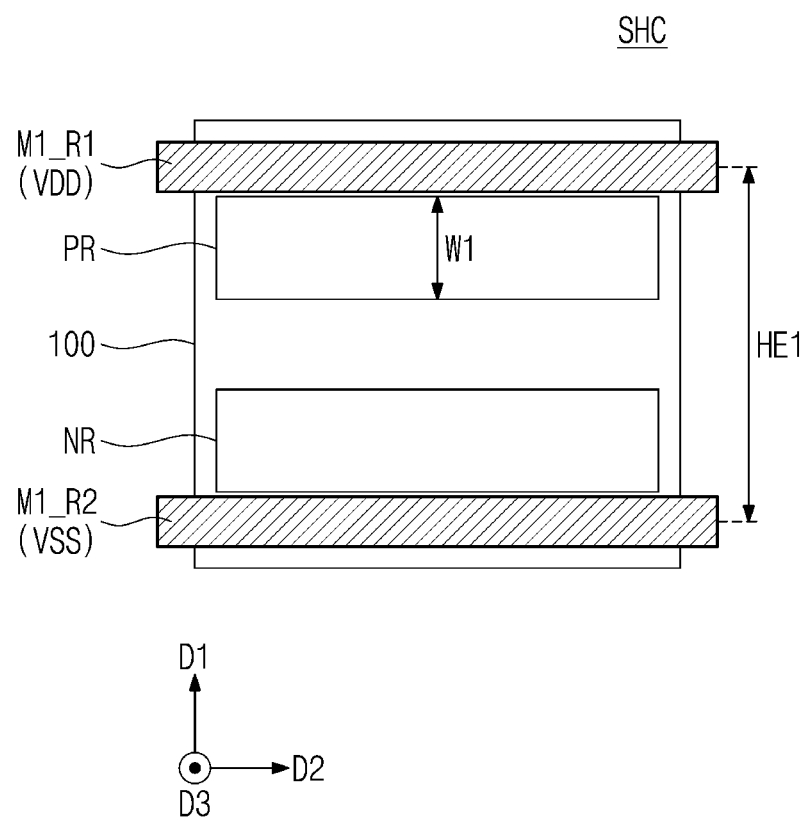
FIGS. 1, 2 and 3 are respective plan (or top-down) views illustrating logic cells of a semiconductor device according to embodiments of the inventive concept.
Figure 2:
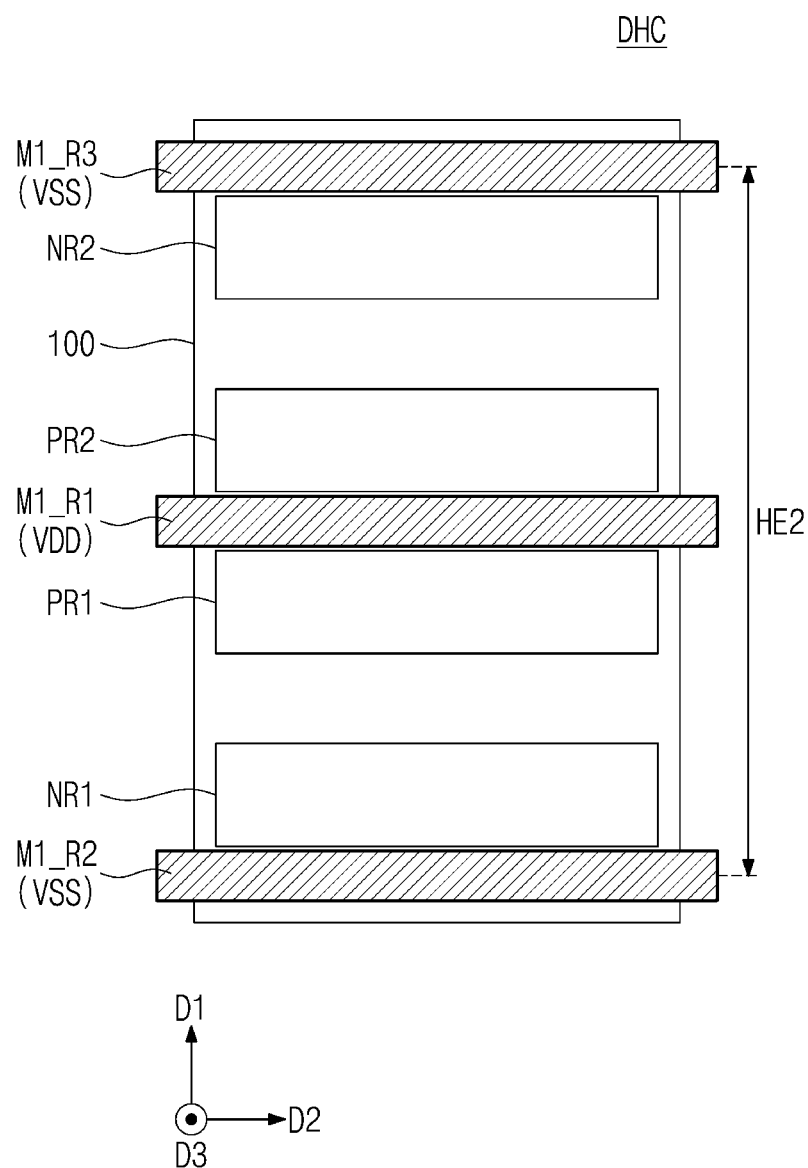
Figure 3:
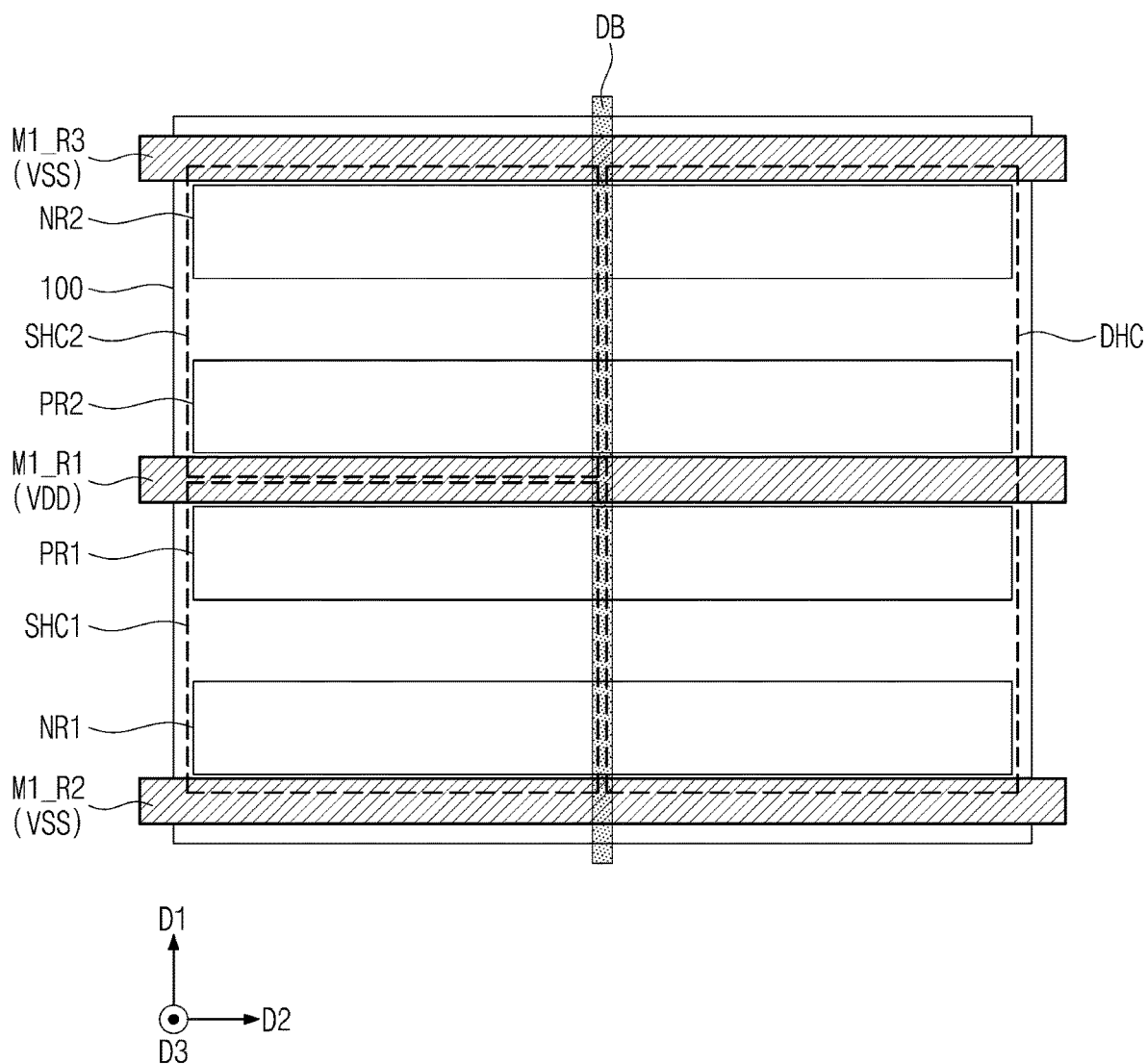

FIGS. 1, 2 and 3 are conceptual plan views illustrating logic cells of a semiconductor device according to embodiments of the inventive concept.

FIG. 1 shows a single height cell SHC. The single height cell SHC may include a substrate 100, as well as a first power line M1_R1 and a second power line M1_R2 on the substrate 100. The first power line M1_R1 may be a path providing a power voltage (e.g., drain voltage VDD). The second power line M1_R2 may be a path providing a ground voltage (e.g., source voltage VSS).

The single height cell SHC may be defined between the first power line M1_R1 and the second power line M1_R2. The single height cell SHC may include a single P-type Metal Oxide Semiconductor (MOS) Field Effect Transistor (FET) (PMOSFET) region PR and a single N-type MOS FET (NMOSFET) region NR. For example, the single height cell SHC may have a complementary metal oxide semiconductor (CMOS) structure provided between the first power line M1_R1 and the second power line M1_R2.

Each of the PMOSFET and NMOSFET regions PR and NR may have a first width W1 in a first direction D1. A first height HE1 may be defined in relation to a length in the first direction D1 of the single height cell SHC. The first height HE1 may be substantially the same as a distance (e.g., pitch) between the first power line M1_R1 and the second power line M1_R2.

The single height cell SHC may constitute one logic cell. In this context, the term "logic cell" denotes a logic device (e.g., as AND, OR, XOR, XNOR, or inverter) capable of performing a specific logic function. A logic cell may variously include transistor(s) and related wiring used to connect the transistor(s).

FIG. 2 shows a double height cell DHC. The double height cell DHC may include; a substrate 100 as well as a first power line M1_R1, a second power line M1_R2, and a third power line M1_R3. Here, the first power line M1_R1 may be disposed between the second power line M1_R2 and the third power line M1_R3, wherein the third power line M1_R3 may be a path connected to drain voltage VDD.

The double height cell DHC may be defined between the second power line M1_R2 and the third power line M1_R3. The double height cell DHC may include a first PMOSFET region PR1, a second PMOSFET region PR2, a first NMOSFET region NR1, and a second NMOSFET region NR2.

The first NMOSFET region NR1 may be adjacent to the second power line M1_R2. The second NMOSFET region NR2 may be adjacent to the third power line M1_R3. The first and second PMOSFET regions PR1 and PR2 may be adjacent to the first power line M1_R1. The first power line M1_R1 may be disposed between the first and second PMOSFET regions PR1 and PR2.

A second height HE2 may be defined in relation to a length in the first direction D1 of the double height cell DHC. The second height HE2 may be about twice the first height HE1 of FIG. 1. The first and second PMOSFET regions PR1 and PR2 of the double height cell DHC may collectively operate as a single PMOSFET region.

Accordingly, the double height cell DHC may have a PMOS transistor with a channel size greater than that of a PMOS transistor included in the single height cell SHC of FIG. 1. For example, the channel size of the PMOS transistor included in the double height cell DHC may be about twice that of the PMOS transistor included in the single height cell SHC.

With the foregoing in mind, the double height cell DHC may operate at a higher speed than that of the single height cell SHC. In some embodiments, the double height cell DHC shown in FIG. 2 may be referred to as a multi-height cell. However, those skilled in the art will appreciate that the term multi-height cell may further encompass a triple height cell having a cell height that is about three times that of the single height cell SHC.

Referring to FIG. 3, a substrate 100 may include a first single height cell SHC1, a second single height cell SHC2, and a double height cell DHC. In the illustrated example of FIG. 3, it is assumed that SHC1, SHC2, and DHC are two-dimensionally disposed in the first direction D1 and a second direction D2. The first single height cell SHC1 may be disposed between a first power line M1_R1 and a second power line M1_R2. The second single height cell SHC2 may be disposed between the first power line M1_R1 and a third power line M1_R3. The second single height cell SHC2 may be adjacent in a first direction D1 to the first single height cell SHC1.

The double height cell DHC may be disposed between the second power line M1_R2 and the third power line M1_R3. The double height cell DHC may be adjacent in a second direction D2 to the first and second single height cells SHC1 and SHC2.

A separation structure DB may be provided between the first single height cell SHC1 and the double height cell DHC and between the second single height cell SHC2 and the double height cell DHC. The separation structure DB may be used to electrically separate an active region of the double height cell DHC from an active region of each of the first and second single height cells SHC1 and SHC2.

Figure 4:
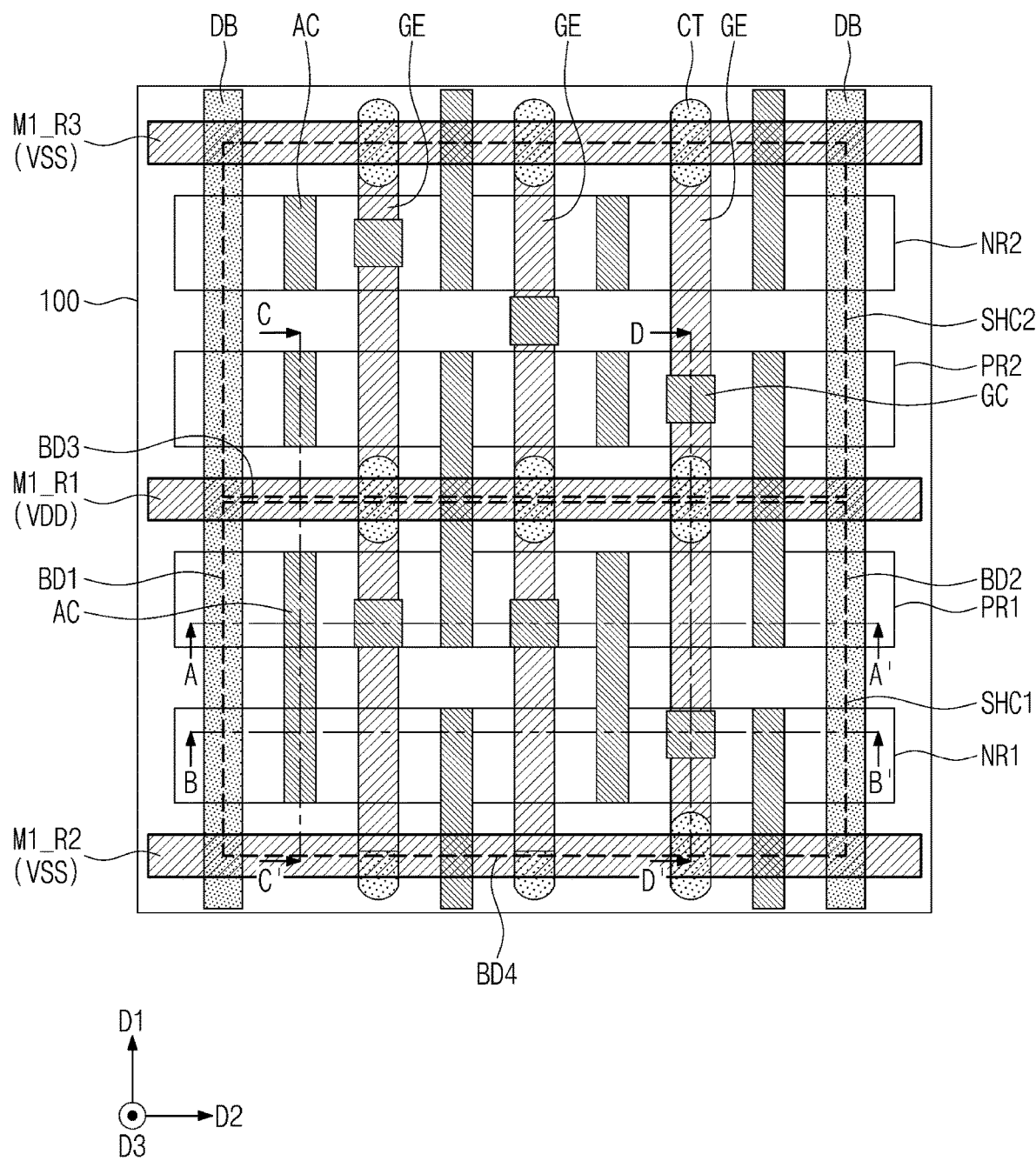
FIG. 4 is a plan view illustrating a semiconductor device according to embodiments of the inventive concept.

FIG. 4 is a plan view illustrating a semiconductor device according to embodiments of the inventive concept; FIGS. 5A, 5B, 5C, and 5D are cross-sectional views respectively taken along lines A-A', B-B', C-C', and D-D' of FIG. 4; and FIG. 6 is an enlarged cross-sectional view further illustrating region 'M' indicated in FIG. 5A. Here, the semiconductor device of FIGS. 4, 5A, 5B, 5C and 5D is presented as one example of the first and second single height cells SHC1 and SHC2 of FIG. 3.

Referring to FIGS. 4, 5A, 5B, 5C and 5D, first and second single height cells SHC1 and SHC2 are provided on a substrate 100. Each of the first and second single height cells SHC1 and SHC2 may variously include logic transistors forming, wholly or in part, a logic circuit. The substrate 100 may be a compound semiconductor substrate or a semiconductor substrate including at least one of silicon, germanium, and silicon-germanium. In some embodiments, the substrate 100 may be a silicon substrate.

The substrate 100 may have a first PMOSFET region PR1, a second PMOSFET region PR2, a first NMOSFET region NR1, and a second NMOSFET region NR2. Each of the first PMOSFET region PR1, the second PMOSFET region PR2, the first NMOSFET region NR1, and the second NMOSFET region NR2 may extend in the second direction D2. The first single height cell SHC1 may include the first NMOSFET region NR1 and the first PMOSFET region PR1, and the second single height cell SHC2 may include the second PMOSFET region PR2 and the second NMOSFET region NR2.

A first active pattern AP1 and a second active pattern AP2 may be defined by a trench TR formed on an upper portion of the substrate 100. The first active pattern AP1 may be provided on each of the first and second PMOSFET regions PR1 and PR2. The second active pattern AP2 may be provided on each of the first and second NMOSFET regions NR1 and NR2. The first and second active patterns AP1 and AP2 may extend in the second direction D2. The first and second active patterns AP1 and AP2 may vertically protrude from the substrate 100.

The trench TR may be filled with a device isolation layer ST (e.g., silicon oxide). The device isolation layer ST may not cover any of first and second channel patterns CH1 and CH2 as will be described hereafter in some additional detail.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3 that are sequentially stacked. The first, second, and third semiconductor patterns SP1, SP2, and SP3 may be spaced apart in a third (or vertical) direction D3.

Each of the first, second, and third semiconductor patterns SP1, SP2, and SP3 may include silicon (Si), germanium (Ge), and/or silicon-germanium (SiGe). For example, each of the first, second, and third semiconductor patterns SP1, SP2, and SP3 may include crystalline silicon. In some embodiments, the first, second, and third semiconductor patterns SP1, SP2, and SP3 may be stacked nano-sheets.

A plurality of first source/drain patterns SD1 may be provided on the first active pattern AP1. A plurality of first recesses RS1 may be formed on an upper portion of the first active pattern AP1. First source/drain patterns SD1 may be correspondingly provided in the first recesses RS1. The first source/drain patterns SD1 may be impurity regions having a first conductivity type (e.g., P-type). The first channel pattern CH1 may be interposed between a pair of first source/drain patterns SD1. For example, the pair of first source/drain patterns SD1 may be connected to each other through the stacked first, second, and third semiconductor patterns SP1, SP2, and SP3.

A plurality of second source/drain patterns SD2 may be provided on the second active pattern AP2. A plurality of second recesses RS2 may be formed on an upper portion of the second active pattern AP2. Second source/drain patterns SD2 may be correspondingly provided in the second recesses RS2. The second source/drain patterns SD2 may be impurity regions having a second conductivity type (e.g., N-type). The second channel pattern CH2 may be interposed between a pair of second source/drain patterns SD2. For example, the pair of second source/drain patterns SD2 may be connected to each other through the stacked first, second, and third semiconductor patterns SP1, SP2, and SP3.

The first and second source/drain patterns SD1 and SD2 may be epitaxial patterns formed using a selective epitaxial growth (SEG) process. For example, each of the first and second source/drain patterns SD1 and SD2 may have a top surface disposed at a level higher than that of the third semiconductor pattern SP3. (In this context the term "level" denotes a measurement, usually taken in the vertical direction, in relation to another arbitrarily selected surface). For another example, at least one of the first and second source/drain patterns SD1 and SD2 may have a top surface at substantially the same level as that of a top surface of the third semiconductor pattern SP3.

The first source/drain patterns SD1 may include a semiconductor element (e.g., SiGe) whose lattice constant is greater than that of a semiconductor element of the substrate 100. Therefore, a pair of first source/drain patterns SD1 may provide the first channel pattern CH1 with compressive stress. The second source/drain patterns SD2 may include the same semiconductor element (e.g., Si) as that of the substrate 100.

Each of the first source/drain patterns SD1 may include a buffer layer BFL and a main layer MAL on the buffer layer BFL.

Figure 5A:
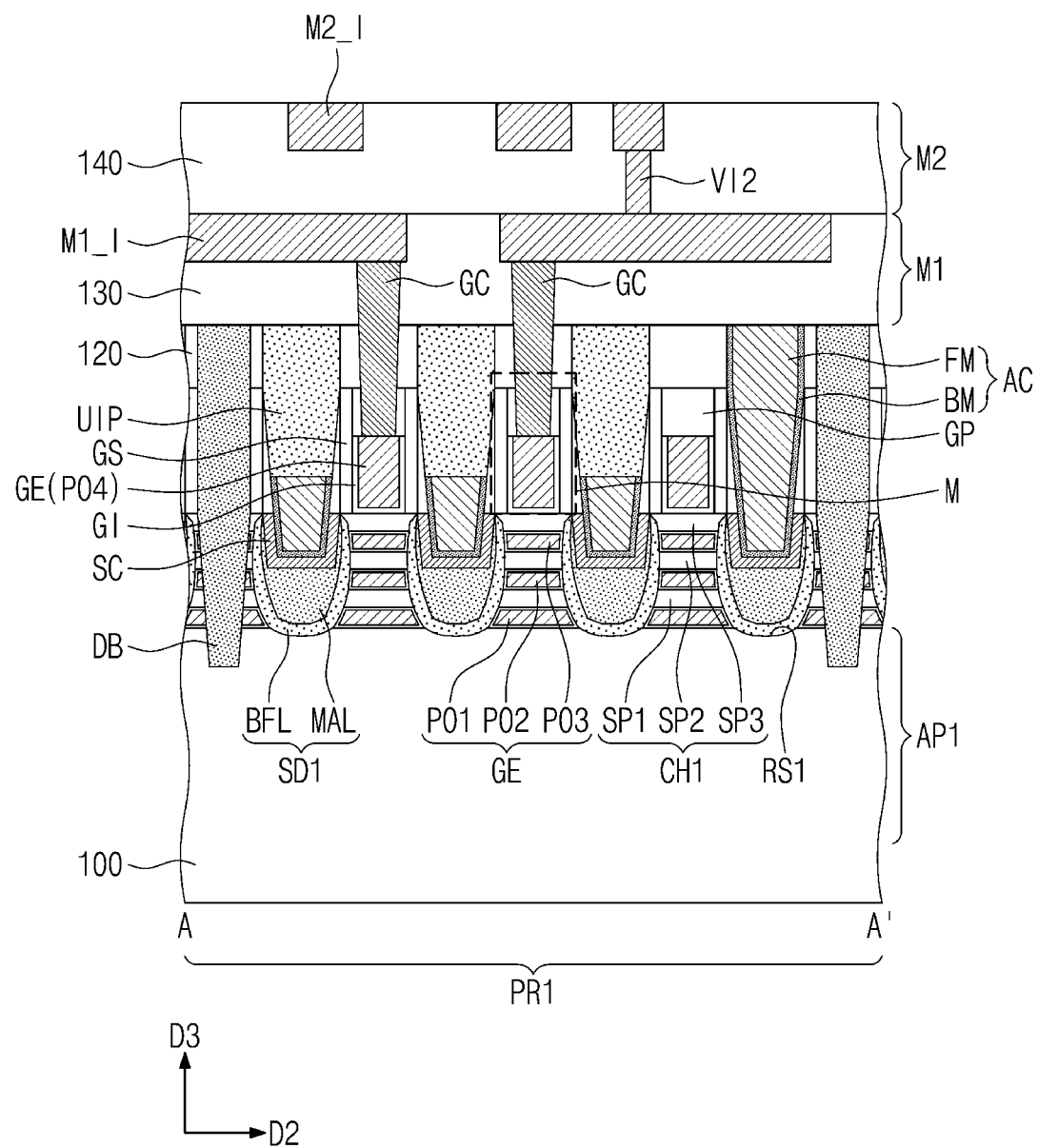
FIGS. 5A, 5B, 5C, and 5D are related cross-sectional views respectively taken along lines A-A', B-B', C-C', and D-D' of FIG. 4.
Figure 6:
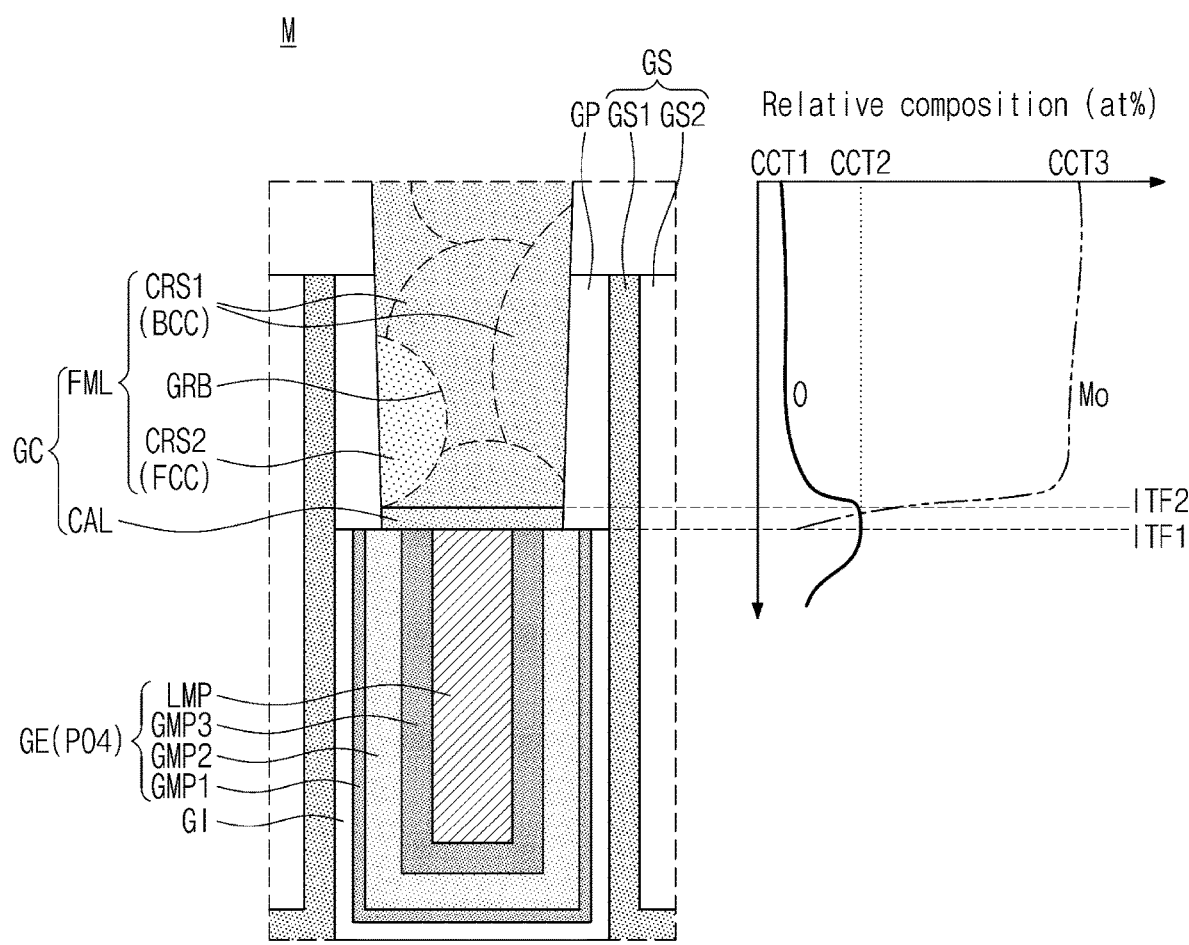
FIG. 6 is an enlarged view further illustrating the region 'M' indicated in FIG. 5A.

Referring to FIG. 5A, a cross-section in the second direction D2 of the first source/drain pattern SD1 will be described.

The buffer layer BFL may cover an inner wall of the first recess RS1. In some embodiments, a thickness of the buffer layer BFL may decrease in a direction from lower toward upper portion thereof. For example, a thickness in the third direction D3 of the buffer layer BFL on floor of the first recess RS1 may be greater than a thickness in the second direction D2 of the buffer layer BFL on an upper portion of the first recess RS1. The buffer layer BFL may have a 'U' shape along a profile of the first recess RS1.

The buffer layer BFL may occupy a portion of the first recess RS1, and the main layer MAL may fill almost all of the unoccupied portion of the first recess RS1. The main layer MAL may have a volume greater than that of the buffer layer BFL. For example, a ratio of volume of the main layer MAL to entire volume of the first source/drain pattern SD1 may be greater than a ratio of volume of the buffer layer BFL to entire volume of the first source/drain pattern SD1.

Each of the buffer layer BFL and the main layer MAL may include silicon-germanium (SiGe). For example, the buffer layer BFL may contain germanium (Ge), albeit at a relatively low concentration. Alternately, the buffer layer BFL may not include germanium (Ge), but may include substantially only silicon (Si). The germanium concentration of the buffer layer BFL may range from about 0 atomic percent (at %) to about 10 at %. For example, the germanium concentration of the buffer layer BFL may range from about 2 at % to about 8 at %.

In contrast, the main layer MAL may contain germanium (Ge) at a relatively high concentration. For example, the germanium concentration of the main layer MAL may range from about 30 at % to about 70 at %. The germanium concentration of the main layer MAL may increase along the third direction D3. For example, the main layer MAL adjacent to the buffer layer BFL may have a germanium concentration of about 40 at %, and an upper portion of the main layer MAL may have a germanium concentration of about 60 at %.

Each of the buffer layer BFL and the main layer MAL may include one or more impurities (e.g., boron, gallium, and indium) causing the first source/drain pattern SD1 to exhibit a P-type conductivity. For example, each of the buffer layer BFL and the main layer MAL may have an impurity concentration ranging from about 1E18 atoms/cm3 to about 5E22 atoms/cm3. However, the impurity concentration of the main layer MAL may be greater than that of the buffer layer BFL.

The buffer layer BFL may prevent stacking faults between the main layer MAL and the substrate 100 (or the first active pattern AP1) and between the main layer MAL and the first, second, and third semiconductor patterns SP1, SP2, and SP3. The occurrence of stacking faults may increase a channel resistance. Stacking faults may easily occur at bottom of the first recess RS1. Accordingly, it may be preferable that the buffer layer BFL adjacent to the bottom of the first recess RS1 should have a relatively greater thickness to prevent stacking faults.

The buffer layer BFL may protect the main layer MAL while sacrificial layers SAL are replaced with first, second, and third inner electrodes PO1, PO2, and PO3 of a gate electrode GE, a process that will be described in some additional detail hereafter. For example, the buffer layer BFL may prevent the main layer MAL from being etched using an etching material used to selectively remove portions of the sacrificial layers SAL.

Referring to FIGS. 4, 5A, 5B 5C and 5D, gate electrodes GE may be formed to extend in a first direction D1 while running across the first and second channel patterns CH1 and CH2. The gate electrodes GE may be arranged at a first pitch in the second direction D2. Each of the gate electrodes GE may vertically overlap the first and second channel patterns CH1 and CH2.

The gate electrode GE may include a first inner electrode PO1 interposed between the first semiconductor pattern SP1 and the active pattern AP1 or AP2, a second inner electrode PO2 interposed between the first semiconductor pattern SP1 and the second semiconductor pattern SP2, a third inner electrode PO3 interposed between the second semiconductor pattern SP2 and the third semiconductor pattern SP3, and an outer electrode PO4 on the third semiconductor pattern SP3.

Referring to FIG. 5A, on the first PMOSFET region PR1, the gate electrode GE may have different widths at the first, second, and third inner electrodes PO1, PO2, and PO3 thereof. For example, a maximum width in the second direction D2 of the third inner electrode PO3 may be greater than a maximum width in the second direction D2 of the second inner electrode PO2. A maximum width in the second direction D2 of the first inner electrode PO1 may be greater than the maximum in the second direction D2 of the third inner electrode PO3.

Figure 5B:
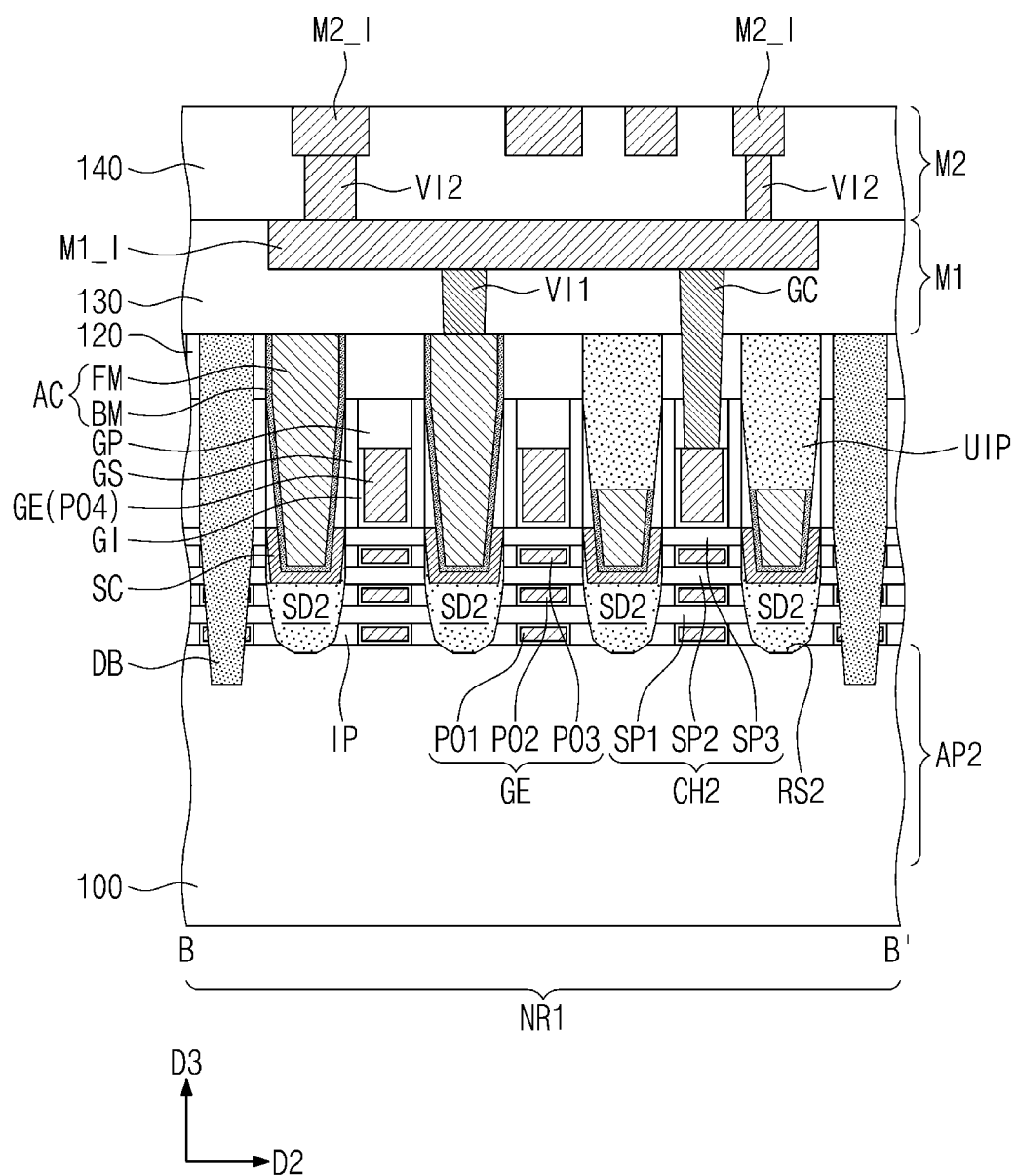
Figure 5C:
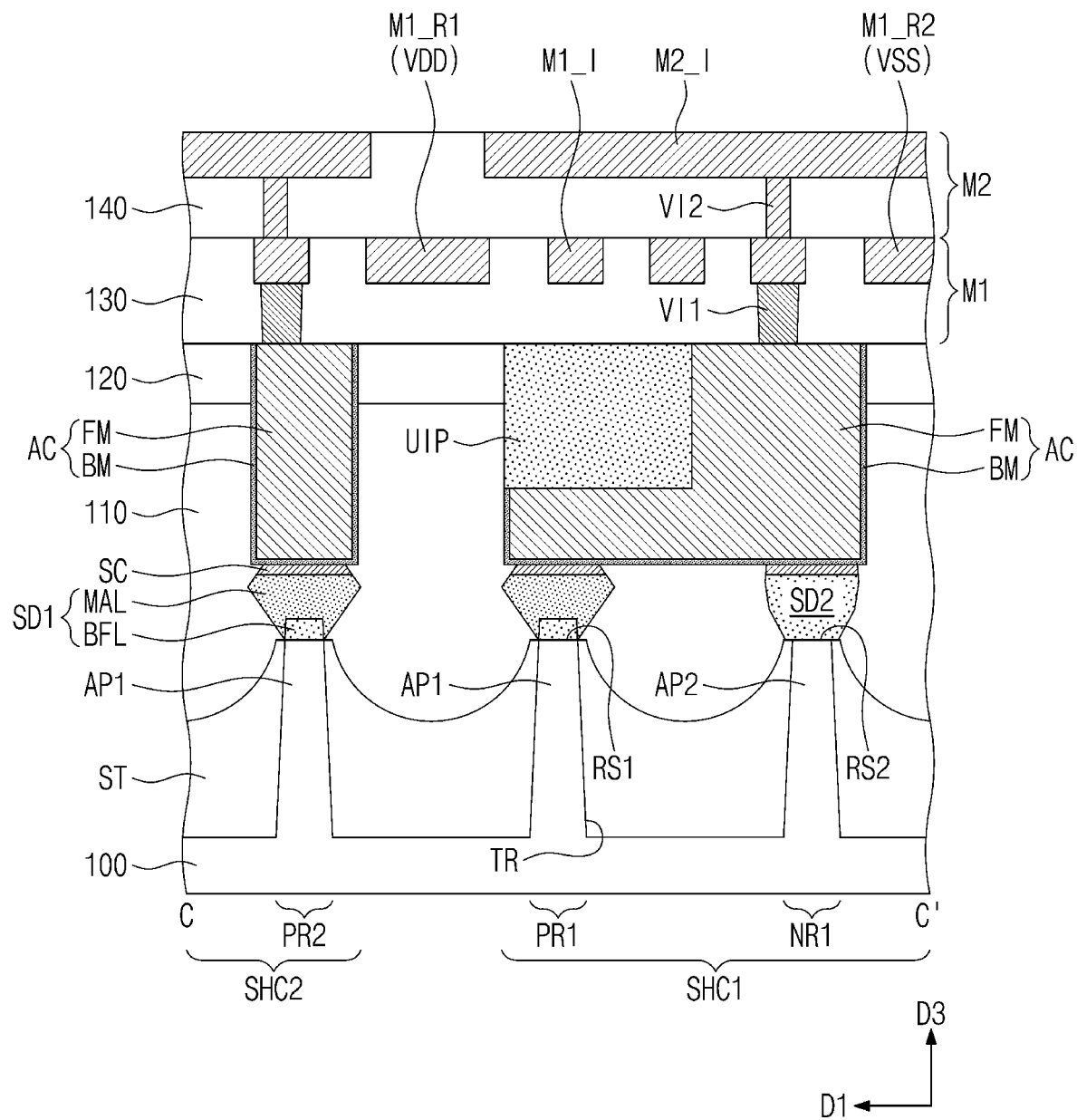
Figure 5D:
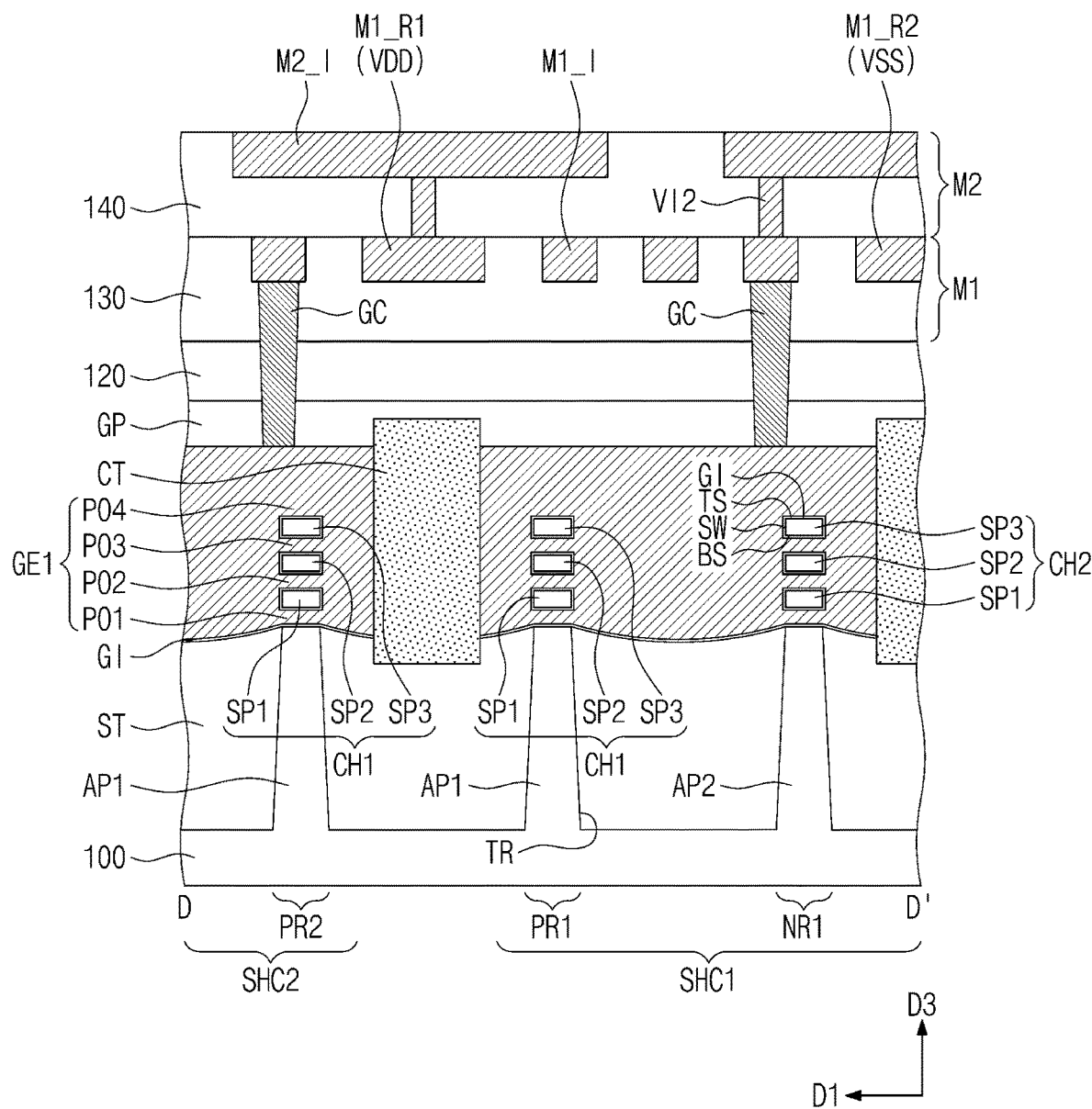

Referring to FIG. 5D, the gate electrode GE may be provided on a top surface TS, a bottom surface BS, and opposing sidewalls SW of each of the first, second, and third semiconductor patterns SP1, SP2, and SP3. For example, in some embodiments, a transistor may be a three-dimensional FET (e.g., MBCFET or GAAFET) in which the gate electrode GE three-dimensionally surrounds the first and second channel patterns CH1 and CH2.

In some embodiments, the first single height cell SHC1 may include a first boundary BD1 and an opposing second boundary BD2, wherein the first and second boundaries BD1 and BD2 extend in the first direction D1. The first single height cell SHC1 may include a third boundary BD3 and an opposing fourth boundary BD4, wherein the third and fourth boundaries BD3 and BD4 extend in the second direction D2.

Gate cutting patterns CT may be disposed on a boundary in the second direction D2 of each of the first and second single height cells SHC1 and SHC2. For example, the gate cutting patterns CT may be disposed on the third and fourth boundaries BD3 and BD4 of the first single height cell SHC1. The gate cutting patterns CT may be arranged at the first pitch along the third boundary BD3. The gate cutting patterns CT may be arranged at the first pitch along the fourth boundary BD4. The gate cutting patterns CT on the third and fourth boundaries BD3 and BD4 may be disposed to correspondingly overlap the gate electrodes GE. The gate cutting patterns CT may include a dielectric material, such as a silicon oxide layer, a silicon nitride layer, or a combination thereof.

The gate cutting pattern CT may separate the gate electrode GE on the first single height cell SHC1 from the gate electrode GE on the second single height cell SHC2. The gate cutting pattern CT may be interposed between the gate electrode GE on the first single height cell SHC1 and the gate electrode GE on the second single height cell SHC2, which gate electrodes GE are aligned in the first direction D1. For example, the gate cutting patterns CT may divide the gate electrode GE, which extends in the first direction D1, into a plurality of gate electrodes GE.

A pair of gate spacers GS may be disposed on opposing sidewalls of each of the gate electrodes GE. The gate spacers GS may extend in the first direction D1 along the gate electrode GE. The gate spacers GS may have their top surfaces higher than that of the gate electrode GE. The top surfaces of the gate spacers GS may be coplanar with that of a first interlayer dielectric layer 110, as will be described in some additional detail hereafter. In some embodiments, the gate spacers GS may include at least one of SiCN, SiCON, and SiN. In other embodiments, the gate spacers GS may include a multiple layer formed of at least two of SiCN, SiCON, and SiN.

A gate capping pattern GP may be provided on the gate electrode GE. The gate capping pattern GP may extend in the first direction D1 along the gate electrode GE. The gate capping pattern GP may include a material having an etch selectivity with respect to first and second interlayer dielectric layers 110 and 120, as described hereafter in some additional detail. For example, the gate capping pattern GP may include at least one of SiON, SiCN, SiCON, and SiN.

A gate dielectric layer GI may be interposed between the gate electrode GE and the first channel pattern CH1 and between the gate electrode GE and the second channel pattern CH2. The gate dielectric layer GI may cover the top surface TS, the bottom surface BS, and the opposing sidewalls SW of each of the first, second, and third semiconductor patterns SP1, SP2, and SP3. The gate dielectric layer GI may cover a top surface of the device isolation layer ST that underlies the gate electrode GE.

In some embodiments, the gate dielectric layer GI may include at least one of a silicon oxide layer, a silicon oxynitride layer, and a high-k dielectric layer. The high-k dielectric layer may include a high-k dielectric material having a dielectric constant greater than that of silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

Alternately, a semiconductor device consistent with embodiments of the inventive concept may include a negative capacitance FET that uses a negative capacitor. For example, the gate dielectric layer GI may include a ferroelectric material layer that exhibits ferroelectric properties and a paraelectric material layer that exhibits paraelectric properties.

The ferroelectric material layer may have a negative capacitance, and the paraelectric material layer may have a positive capacitance. For example, where two or more capacitors are connected in series and each capacitor has a positive capacitance, an overall capacitance may be reduced to less than that of each of the series-connected capacitors. In contrast, when at least one of the two or more series-connected capacitors has a negative capacitance, an overall capacitance may have a positive value greater than an absolute value of the capacitance of each of the series-connected capacitors.

When the ferroelectric material layer having a negative capacitance is connected in series to the paraelectric material layer having a positive capacitance, there may be an increase in overall capacitance of the series-connected ferroelectric and paraelectric material layers. The increase in overall capacitance may be enable a transistor including the ferroelectric material layer to have a sub-threshold swing of less than about 60 mV/decade at room temperature.

The ferroelectric material layer may have ferroelectric properties. The ferroelectric material layer may include, for example, at least one of hafnium oxide, hafnium zirconium oxide, barium strontium titanium oxide, and lead zirconium titanium oxide. Here, the hafnium zirconium oxide may be a material in which hafnium oxide is doped with zirconium (Zr). Alternately, the hafnium zirconium oxide may be a compound including hafnium (Hf), zirconium (Zr), and oxygen (O).

The ferroelectric material layer may be doped with one or more impurities, such as aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of impurities included in the ferroelectric material layer may vary on the nature of the ferroelectric material included in the ferroelectric material layer.

However, if the ferroelectric material layer includes hafnium oxide, the ferroelectric material layer may be doped with least one of gadolinium (Gd), silicon (Si), zirconium (Zr), aluminum (Al), and yttrium (Y). In cases where the impurities are aluminum (Al), the ferroelectric material layer may include about 3 to 8 at % of aluminum (e.g., the ratio of impurities may be a ratio of aluminum to the sum of hafnium and aluminum). In cases where the impurities are silicon (Si), the ferroelectric material layer may include about 2 to 10 at % of silicon. In cases where the impurities are yttrium (Y), the ferroelectric material layer may include about 2 to 10 at % of yttrium. In cases where the impurities are gadolinium (Gd), the ferroelectric material layer may include about 1 to 7 at % of gadolinium. And in cases where the impurities are zirconium (Zr), the ferroelectric material layer may include about 50 to 80 at % of zirconium.

The paraelectric material layer may have paraelectric properties. The paraelectric material layer may include, for example, at least one of silicon oxide and high-k metal oxide. The metal oxide included in the paraelectric material layer may include, for example, one or more of hafnium oxide, zirconium oxide, and aluminum oxide, but the inventive concept is not limited thereto.

The ferroelectric and paraelectric material layers may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a crystal structure different from that of the hafnium oxide included in the paraelectric material layer.

The ferroelectric material layer may have a thickness exhibiting ferroelectric properties. The thickness of the ferroelectric material layer may range, for example, from about 0.5 nm to about 10 nm, but inventive concept are not limited thereto. Since ferroelectric materials have their own critical thickness that exhibits ferroelectric properties, the thickness of the ferroelectric material layer may depend on ferroelectric material.

For example, the gate dielectric layer GI may include a single ferroelectric material layer. For another example, the gate dielectric layer GI may include a plurality of spaced-apart ferroelectric material layers. The gate dielectric layer GI may have a stack structure in which a plurality of ferroelectric material layers are alternately stacked with a plurality of paraelectric material layers.

Referring to FIG. 5B, inner spacers IP may be provided on the first and second NMOSFET regions NR1 and NR2. For example, the inner spacers IP may be provided on the second active pattern AP2. The inner spacers IP may be correspondingly interposed between the second source/drain pattern SD2 and the first, second, and third inner electrodes PO1, PO2, and PO3 of the gate electrode GE. The inner spacers IP may be in direct contact with (e.g., without intervening material) the second source/drain pattern SD2. The inner spacer IP may separate the second source/drain pattern SD2 of the first, second, and third inner electrodes PO1, PO2, and PO3 of the gate electrode GE.

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with that of the gate capping pattern GP and that of the gate spacer GS. The first interlayer dielectric layer 110 may be provided thereon with a second interlayer dielectric layer 120 that covers the gate capping pattern GP. A third interlayer dielectric layer 130 may be provided on the second interlayer dielectric layer 120. A fourth interlayer dielectric layer 140 may be provided on the third interlayer dielectric layer 130. For example, the first to fourth interlayer dielectric layers 110 to 140 may include a silicon oxide layer.

Each of the first and second single height cells SHC1 and SHC2 may be provided on opposing sides with a pair of separation structures DB that oppose each other in the second direction D2. For example, the pair of separation structures DB may be correspondingly provided on first and second boundaries BD1 and BD2 of the first single height cell SHC1. The separation structure DB may extend in the first direction D1 parallel to the gate electrodes GE. A pitch between the separation structure DB and its adjacent gate electrode GE may be the same as the first pitch.

The separation structure DB may penetrate the first and second interlayer dielectric layers 110 and 120, and may extend into the first and second active patterns AP1 and AP2. The separation structure DB may penetrate an upper portion of each of the first and second active patterns AP1 and AP2. The separation structure DB may electrically separate an active region of each of the first and second single height cells SHC1 and SHC2 from an active region of another cell.

Active contacts AC may be provided to penetrate the first and second interlayer dielectric layers 110 and 120 to come into electrical connection with the first and second source/drain patterns SD1 and SD2. A pair of active contacts AC may be correspondingly provided on opposing sides of the gate electrode GE. The active contact AC may have a bar shape that extends in the first direction D1.

The active contact AC may be a self-aligned contact. For example, the gate capping pattern GP and the gate spacer GS may be used to form the active contact AC in a self-alignment manner. The active contact AC may cover, for example, at least a portion of a sidewall of the gate spacer GS. Although not shown, the active contact AC may cover a portion of the top surface of the gate capping pattern GP.

A metal-semiconductor compound layer SC, such as a silicide layer, may be interposed between the active contact AC and the first source/drain pattern SD1 and between the active contact AC and the second source/drain pattern SD2. The active contact AC may be electrically connected through the metal-semiconductor compound layer SC to one of the first and second source/drain patterns SD1 and SD2. For example, the metal-semiconductor compound layer SC may include at least one of titanium silicide, tantalum silicide, tungsten silicide, nickel silicide, and cobalt silicide.

Referring to FIG. 5C, at least one active contact AC on the first single height cell SHC1 may electrically connect the first source/drain pattern SD1 of the first PMOSFET region PR1 to the second source/drain pattern SD2 of the first NMOSFET region NR1. The active contact AC may extend in the first direction D1 from the second source/drain pattern SD2 of the first NMOSFET region NR1 to the first source/drain pattern SD1 of the first PMOSFET region PR1.

The active contact AC may include a barrier metal BM and a fill metal FM on the barrier metal BM. The barrier metal BM may substantially surround a surface of the fill metal FM, except a top surface of the fill metal FM. The fill metal FM may include, for example, at least one of molybdenum, tungsten, ruthenium, cobalt, and vanadium. In some embodiments, the fill metal FM may include molybdenum. The barrier metal BM may include at least one metal nitride layer, such as a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

Gate contacts GC may be provided to penetrate the third interlayer dielectric layer 130, the second interlayer dielectric layer 120, and the gate capping pattern GP to come into electrical connection with the gate electrodes GE. Two gate contacts GC on the first single height cell SHC1 may be disposed to overlap the first PMOSFET region PR1. For example, two gate contacts GC on the first single height cell SHC1 may be provided on the first active pattern AP1. (See, e.g., FIG. 5A).

One gate contact GC on the first single height cell SHC1 may be disposed to overlap the first NMOSET region NR1. For example, one gate contact GC on the first single height cell SHC1 may be provided on the second active pattern AP2. (See, e.g., FIG. 5B).

The gate contact GC may be freely disposed with no limitation of position on the gate electrode GE. For example, the gate contacts GC on the second single height cell SHC2 may be correspondingly disposed on the second PMOSFET region PR2, the second NMOSFET region NR2, and the device isolation layer ST that fills the trench TR. (See, e.g., FIG. 4).

Referring to FIGS. 5A and 5B, in some embodiments, an upper dielectric pattern UIP may fill an upper portion of the active contact AC, which upper portion is adjacent to the gate contact GC. The upper dielectric pattern UIP may have a bottom surface lower than that of the gate contact GC. For example, the upper dielectric pattern UIP may cause the active contact AC adjacent to the gate contact GC to have a top surface lower than the bottom surface of the gate contact GC. Therefore, it may be possible to prevent an electrical short circuit from being formed between the gate contact GC and an adjacent active contact AC.

A first via VI1 may be provided on the active contact AC. The first via VI1 may have a top surface disposed at the same level as that of a top surface of the gate contact GC. In some embodiments, the first via VI1 and the gate contact GC may be formed at the same time. The first via VI1 and the gate contact GC may include the same material.

Unlike the active contact AC, the gate contact GC may include no barrier metal. The gate contact GC may be formed of single metal, such as molybdenum, tungsten, ruthenium, cobalt, and vanadium. In some embodiments, the gate contact GC may include molybdenum. Likewise, the gate contact GC, the first via VI1 may include no barrier metal. The first via VI1 may include the same metal as that of the gate contact GC.

A first metal layer M1 may be provided in the third interlayer dielectric layer 130. For example, the first metal layer M1 may include a first power line M1_R1, a second power line M1_R2, a third power line M1_R3, and first wiring lines M1_I. The lines M1_R1, M1_R2, M1_R3, and M1_I of the first metal layer M1 may extend in parallel to each other in the second direction D2.

For example, the first and second power lines M1_R1 and M1_R2 may be correspondingly provided on the third and fourth boundaries BD3 and BD4 of the first single height cell SHC1. The first power line M1_R1 may extend in the second direction D2 along the third boundary BD3. The second power line M1_R2 may extend in the second direction D2 along the fourth boundary BD4.

The first wiring lines M1_I of the first metal layer M1 may be arranged at a second pitch along the first direction D1. The second pitch may be less than the first pitch. Each of the first wiring lines M1_I may have a linewidth less than that of each of the first, second, and third power lines M1_R1, M1_R2, and M1_R3.

The first via VI1 may electrically connect the active contact AC to one of the lines M1_R1, M1_R2, M1_R3, and M1_I of the first metal layer M1. The gate electrode GE may be electrically connected through the gate contact GC to one of the lines M1_R1, M1_R2, M1_R3, and M1_I of the first metal layer M1.

A respective one of the foregoing lines as well as its underlying first via VI1 of the first metal layer M1 may be formed using individual processes. For example, the respective line and its underlying first via VI1 of the first metal layer M1 may each be formed using a single damascene process. In some embodiments, a sub-20 nm process may be employed to fabricate a semiconductor device.

A second metal layer M2 may be provided in the fourth interlayer dielectric layer 140. The second metal layer M2 may include a plurality of second wiring lines M2_I. The second wiring lines M2_I of the second metal layer M2 may each have a linear or bar shape that extends in the first direction D1. For example, the second wiring lines M2_I may extend in parallel to each other in the first direction D1.

The second metal layer M2 may further include second vias VI2 that are correspondingly provided below the second wiring lines M2_I. A respective line of the first metal layer M1 may be electrically through the second via VI2 to a corresponding line of the second metal layer M2. For example, a wiring line and its underlying second via VI2 of the second metal layer M2 may be simultaneously formed using a dual damascene process.

The first and second metal layers M1 and M2 may have their wiring lines that include the same or different conductive materials. For example, the first and second metal layers M1 and M2 may have their lines including at least one metal, such as copper, ruthenium, aluminum, tungsten, molybdenum, and cobalt. Although not shown, other metal layers (e.g., M3, M4, M5, etc.) may be additionally stacked on the fourth interlayer dielectric layer 140. Each of the stacked metal layers may include wiring lines for routing between cells.

Referring to FIG. 6, certain details of the gate electrode GE and the gate contact GC will be described in some additional detail. The gate electrode GE may include a first metal pattern GMP1, a second metal pattern GMP2, a third metal pattern GMP3, and a fill metal pattern LMP that are sequentially stacked on the gate dielectric layer GI.

The first metal pattern GMP1 may be a capping layer interposed between the second metal pattern GMP2 and the gate dielectric layer GI. The first metal pattern GMP1 may include a metal nitride layer. The first metal pattern GMP1 may include nitrogen (N) and at least one metal, such as titanium (Ti), tantalum (Ta), aluminum (Al), tungsten (W), and molybdenum (Mo). For example, the first metal pattern GMP1 may include TiN.

The second metal pattern GMP2 may include a first work-function metal that controls a threshold voltage of a transistor. A composition of the first work-function metal may be adjusted to achieve a desired threshold voltage of the transistor. For example, the first work-function metal may be an N-type work-function metal whose work-function is relatively low.

The second metal pattern GMP2 may include metal carbide. The second metal pattern GMP2 may include metal carbide doped with (or containing) silicon and/or aluminum. For example, the second metal pattern GMP2 may include at least one of aluminum-doped titanium carbide (TiAlC), aluminum-doped tantalum carbide (TaAlC), aluminum-doped vanadium carbide (VAlC), silicon-doped titanium carbide (TiSiC), and silicon-doped tantalum carbide (TaSiC).

As possible examples, the second metal pattern GMP2 may include: (1) least one of aluminum-silicon-doped titanium carbide (TiAlSiC) and aluminum-silicon-doped tantalum carbide (TaAlSiC); (2) aluminum-doped titanium (TiAl); and (3) a metal nitride doped with silicon and/or aluminum (e.g., aluminum-doped titanium nitride (TiAlN)).

A work function of the second metal pattern GMP2 may be altered by controlling a concentration of dopants (or impurities) such as silicon or aluminum. For example, impurities (e.g., silicon or aluminum) in the second metal pattern GMP2 may have a concentration ranging from about 0.1 at % to about 25 at %.

The third metal pattern GMP3 may include a second work-function metal that controls a threshold voltage of a transistor. A composition of the second work-function metal may be adjusted to achieve a desired threshold voltage of the transistor. For example, the second work-function metal may be a P-type work-function metal having a relatively high work-function.

The third metal pattern GMP3 may include a metal nitride layer. That is, the third metal pattern GMP3 may include nitrogen (N) and at least one metal, such as titanium (Ti), tantalum (Ta), aluminum (Al), tungsten (W), and molybdenum (Mo). For example, the third metal pattern GMP3 may include at least one of titanium nitride (TiN), tantalum nitride (TaN), titanium oxynitride (TiON), titanium silicon nitride (TiSiN), titanium aluminum nitride (TiAlN), tungsten carbon nitride (WCN), and molybdenum nitride (MoN).

The fill metal pattern LMP may be provided on the third metal pattern GMP3. The fill metal pattern LMP may have a resistance less than those of the first to third metal patterns GMP1 to GMP3. For example, the fill metal pattern LMP may include at least one low-resistance metal such as aluminum (Al), tungsten (W), titanium (Ti), and tantalum (Ta).

The fill metal pattern LMP may be omitted in view of, for example, a gate length, or a width in the second direction D2 of the gate electrode GE. For example, when the gate electrode GE has an extremely short gate length, the fill metal pattern LMP may be omitted because of insufficient space to be filled with the fill metal pattern LMP.

In some embodiments, the gate spacer GS may include a first spacer GS1 on a sidewall of the outer electrode PO4 and a second spacer GS2 on the first spacer GS1. Each of the first and second spacers GS1 and GS2 may include a silicon-containing dielectric material. For example, the first spacer GS1 may include a silicon-containing low-k dielectric material, for example, SiCON. The second spacer GS2 may include a silicon-containing dielectric material with excellent resistance to etching, such SiN. The second spacer GS2 may act as an etch stop layer when the active contact AC is formed. The second spacer GS2 may be caused to form the active contact AC in a self-alignment manner.

The gate contact GC may be directly connected (e.g., without intervening material) to the top surface of the gate electrode GE. The gate contact GC may include a capping layer CAL and a metal layer FML. The capping layer CAL and the metal layer FML may include the same metal (e.g., molybdenum). Therefore, the capping layer CAL and the metal layer FML may be integrally connected to constitute one gate contact GC. Here, an interface between the capping layer CAL and the metal layer FML may not be detectable using an electron microscope.

In some embodiments, the gate contact GC may be formed using an atomic layer deposition (ALD) process that uses a metal precursor. The capping layer CAL may be formed using an ALD process that uses a first metal precursor (e.g., $MoCl_5$) containing no oxygen atom. The metal layer FML may be formed using an ALD process that uses a second metal precursor (e.g., $MoO_2Cl_2$) containing an oxygen atom. The capping layer CAL and the metal layer FML may be deposited by respectively using the first and second metal precursors, but a finally remaining material may be molybdenum.

The second metal precursor containing an oxygen atom may have a relatively large vapor pressure, and thus a metal layer may be promptly deposited. In contrast, the second metal precursor containing an oxygen atom may oxidize an exposed top surface of the gate electrode GE. Therefore, a thin oxide layer may be formed between the gate contact GC and the top surface of the gate electrode GE, which may result in an increase in contact resistance between the gate electrode GE and the gate contact GC. As a result, a resulting semiconductor device may suffer from degradation of certain electrical properties.

The first metal precursor containing no oxygen atom may not oxide the exposed top surface of the gate electrode GE, and thus an oxidation layer may be prevented formed being formed between the gate electrode GE and the gate contact GC. However, the first metal precursor has a relatively low vapor pressure, and thus the first metal precursor may have a problem of low deposition rate.

In some embodiments, the first metal precursor may be used to form the capping layer CAL in direct contact with the top surface of the gate electrode GE. Thus, the formation of an oxidation layer between the gate electrode GE and the gate contact GC may be prevented. As the capping layer CAL is formed with an extremely small thickness (e.g., about 2 nm to about 4 nm), it may be possible to address the low deposition rate of the first metal precursor. The metal layer FML on the capping layer CAL may be formed using the second metal precursor having a relatively high deposition rate. Accordingly, semiconductor devices according to embodiments of the inventive concept may exhibit improved electrical properties, and yet achieve high process efficiency.

FIG. 6 also illustrates a result of electro energy loss spectroscopy (EELS) analysis based on depth in the gate contact GC. In studying an atomic fraction of oxygen (O) in the gate contact GC, oxygen (O) in the metal layer FML may have a first concentration CCT1 (e.g., ranging from about 2 at % to about 10 at %).

There may be an increase in the concentration of oxygen (O) in the capping layer CAL. For example, the concentration of oxygen (O) may increase from an interface ITF2 between the metal layer FML and the capping layer CAL. At the interface ITF1 between the capping layer CAL and the gate electrode GE, oxygen (O) may have a maximum concentration, or a second concentration CCT2. The second concentration CCT2 may range from about 15 at % to about 30 at %. An oxygen atom may diffuse from the exposed top surface of the gate electrode GE, and for this reason, oxygen (O) may have the maximum concentration CCT2 at the interface ITF2 between the capping layer CAL and the gate electrode GE.

In a comparative example assuming the use of a second metal precursor (e.g., $MoO_2Cl_2$) including oxygen, without the capping layer CAL being used to form the gate contact GC directly on the gate electrode GE, a maximum concentration of oxygen (O) may be greater than about 50 at % at the interface ITF1 between the gate contact GC and the gate electrode GE. As a result, a metal oxidation layer will be distinctly formed between the gate contact GC and the gate electrode GE.

In contrast, embodiments of the inventive concept use the first metal precursor (e.g., $MoCl_5$) containing no oxygen atom to form the capping layer CAL directly on the gate electrode GE, and this results in a value less than about 30 at % for a maximum concentration of oxygen (O) at the interface ITF1 between the capping layer CAL and the gate electrode GE. Accordingly, a low resistance may be maintained between the gate contact GC and the gate electrode GE.

In studying an atomic fraction of molybdenum in the gate contact GC, molybdenum (Mo) in the metal layer FML may have a third concentration CCT3. For example, the third concentration CCT3 may range from about 85 at % to about 95 at %. In addition, the gate contact GC may further include impurities such as chlorine (Cl) atoms.

In some embodiments, molybdenum or the metal layer FML may include a first crystal region CRS1 and a second crystal region CRS2. The first crystal region CRS1 may have a first crystal structure, for example, a body centered cubic (BCC) structure. The second crystal region CRS2 may have a second crystal structure, for example, a face centered cubic (FCC) structure.

A grain boundary GRB may be defined between crystal regions. The grain boundary GRB may be present between the first crystal region CRS1 and the second crystal region CRS2 that have different crystal structures. In addition, the grain boundary GRB may also be present between neighboring first crystal regions CRS1 having the same crystal structure.

A ratio of the first crystal regions CRS1 in the metal layer FML may range from about 60% to about 99%. For example, a ratio of volume of the first crystal regions CRS1 to an entire volume of the metal layer FML may range from about 60% to about 99%. For another example, on a two-dimensional cross-section image shown in FIG. 6, a ratio of area of the first crystal regions CRS1 to an entire area of the metal layer FML may range from about 60% to about 99%. The metal layer FML may have a body centered cubic (BCC) structure whose fraction ranges from about 60% to about 99%. The second crystal region CRS2 may occupy a remaining unoccupied region of the metal layer FML except the first crystal regions CRS1.

In some embodiments, molybdenum or the metal layer FML may have a body centered cubic (BCC) structure whose fraction ranges from about 60% to about 99% of a crystal structure of the metal layer FML. For example, molybdenum or the metal layer FML may have a body centered cubic (BCC) structure whose fraction ranges from about 80% to about 99% of a crystal structure of the metal layer FML. A value ranging from about 100 Å to about 500 Å may be given to an average grain size of the first and second crystal regions CRS1 and CRS2 in the metal layer FML. When the second metal precursor is used without the capping layer CAL to form the gate contact GC, the gate contact GC may have an average grain size equal to or less than about 50 Å. For example, the gate contact GC, or the metal layer FML in some embodiments may have a relatively large average grain size.

The first metal precursor containing no oxygen atom may be deposited to have a relatively large grain size, the capping layer CAL may have a relatively large grain size. When the metal layer FML is deposited on the capping layer CAL, the metal layer FML may have a grain size that depends on that of the capping layer CAL that underlies the metal layer FML. Therefore, the metal layer FML may have an average grain size equal to or greater than about 100 Å.

As the metal layer FML has a relatively large average grain size, the metal layer FML may have a reduced resistivity. For example, the metal layer FML in some embodiments may have a resistivity ranging from about 10 μΩcm to about 18 μΩcm. Accordingly, the gate contact GC in some embodiments of the inventive concept may have an extremely low resistance, and thus an incorporating semiconductor device may exhibit markedly improved electrical properties.

The first via VI1 connected to the active contact AC may be formed together with the gate contact GC, and thus the first via VI1 may also include a capping layer CAL and a metal layer FML. Here, formation of the first via VI1 may be substantially the same as that of the gate contact GC previously described.

FIGS. 7A to 14D are cross-sectional views illustrating in one example a method of fabricating a semiconductor device according to embodiments of the inventive concept. Here, FIGS. 7A, 8A, 9A, 10A, 11A, 12A, 13A, and 14A are respective cross-sectional views taken along line A-A' of FIG. 4; FIGS. 9B, 10B, 11B, 12B, 13B, and 14B are respective cross-sectional views taken along line B-B' of FIG. 4; FIGS. 9C, 10C, 11C, 12C, 13C, and 14C are respective cross-sectional views taken along line C-C' of FIG. 4; and FIGS. 7B, 8B, 9D, 10D, 11D, 12D, 13D, and 14D are respective cross-sectional views taken along line D-D' of FIG. 4.

Figure 7A:
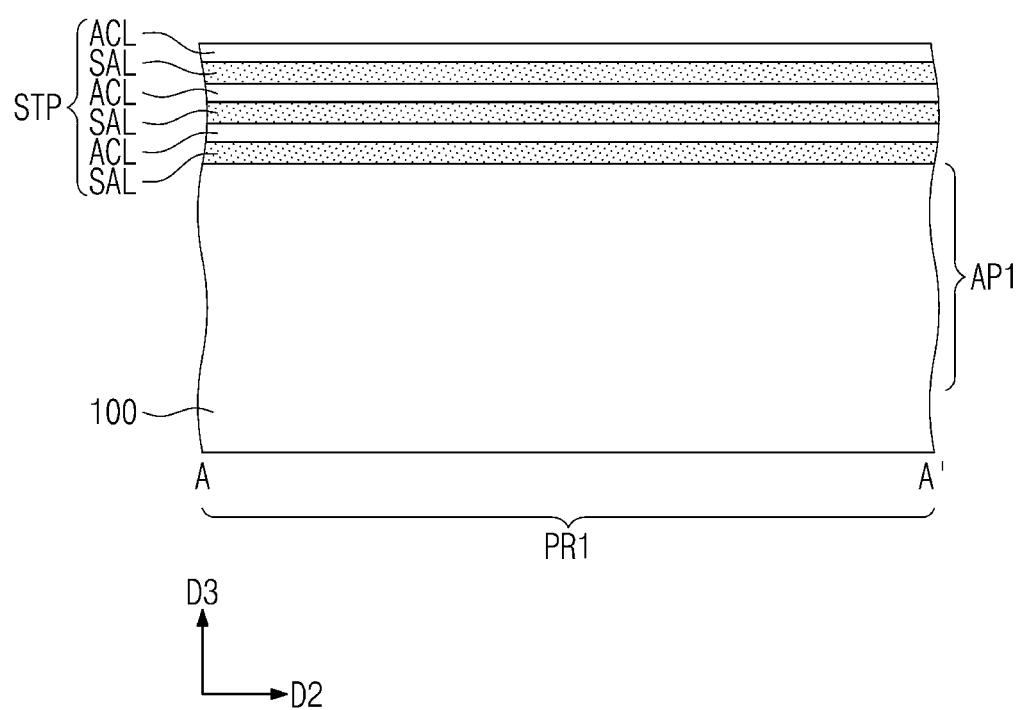
FIGS. 7A, 7B, 8A, 8B, 9A, 9B, 9C, 9D, 10A, 10B, 10C 10D, 11A, 11B, 11C, 11D, 12A, 12B, 12C, 12D, 13A, 13B, 13C, 13D, 14A, 14B, 14C and 14D (hereafter collectively, "FIGS. 7A to 14D") are variously related cross-sectional views illustrating in one example a method of fabricating semiconductor devices according to embodiments of the inventive concept.
Figure 7B:
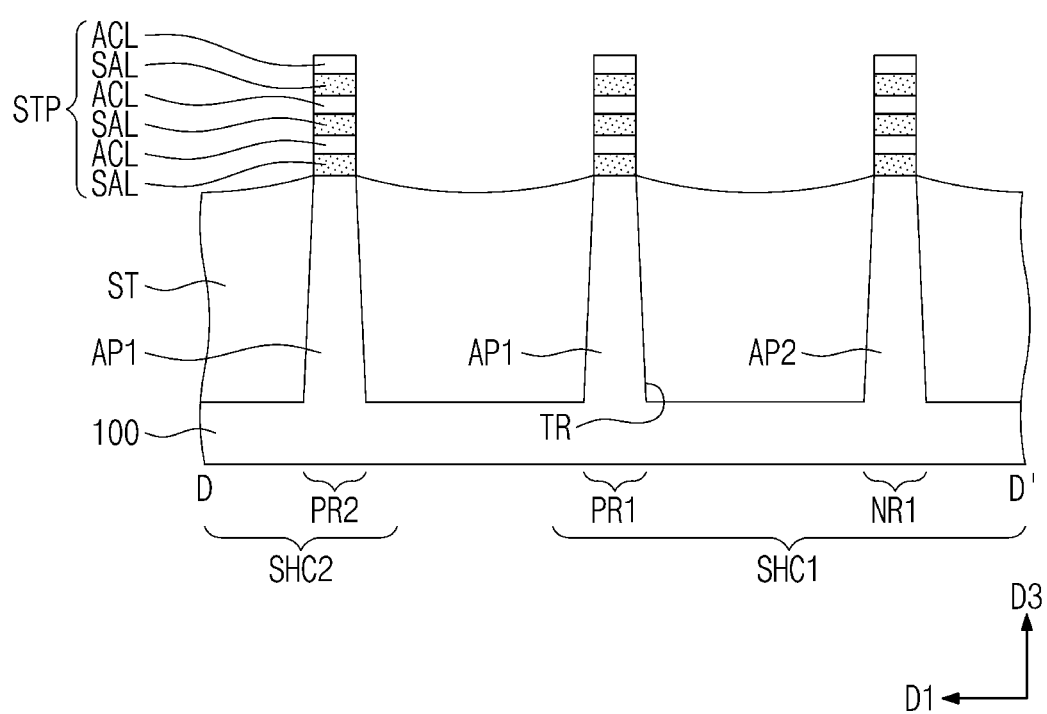

Referring to FIGS. 7A and 7B, the substrate 100 may include first and second PMOSFET regions PR1 and PR2 and first and second NMOSFET regions NR1 and NR2. Active layers ACL and sacrificial layers SAL may be alternately stacked on the substrate 100. The active layers ACL may include one of silicon (Si), germanium (Ge), and silicon-germanium (SiGe), and the sacrificial layers SAL may include another of silicon (Si), germanium (Ge), and silicon-germanium (SiGe).

The sacrificial layer SAL may include a material having an etch selectivity with respect to the active layer ACL. For example, the active layers ACL may include silicon (Si), and the sacrificial layers SAL may include silicon-germanium (SiGe). Each of the sacrificial layers SAL may have a germanium concentration of about 10 at % to about 30 at %.

Mask patterns may be correspondingly formed on the first and second PMOSFET regions PR1 and PR2 and the first and second NMOSFET regions NR1 and NR2 of the substrate 100. The mask pattern may have a linear or bar shape that extends in a second direction D2.

A patterning process may be performed in which the mask patterns are used as an etching mask to form a trench TR that defines a first active pattern AP1 and a second active pattern AP2. The first active pattern AP1 may be formed on each of the first and second PMOSFET regions PR1 and PR1. The second active pattern AP2 may be formed on each of the first and second NMOSFET regions NR1 and NR2.

A stack pattern STP may be formed on each of the first and second active patterns AP1 and AP2. The stack pattern STP may include the active layers ACL and the sacrificial layers SAL that are alternately stacked. During the patterning process, the stack pattern STP may be formed together with the first and second active patterns AP1 and AP2.

A device isolation layer ST may be formed to fill the trench TR. For example, a dielectric layer may be formed on an entire surface of the substrate 100 to cover the stack patterns STP and the first and second active patterns AP1 and AP2. The dielectric layer may be recessed until the stack patterns STP are exposed, and thus the device isolation layer ST may be formed.

The device isolation layer ST may include a dielectric material, such as a silicon oxide layer. The stack patterns STP may be exposed upwardly from the device isolation layer ST. For example, the stack patterns STP may vertically protrude upwards from the device isolation layer ST.

Figure 8A:
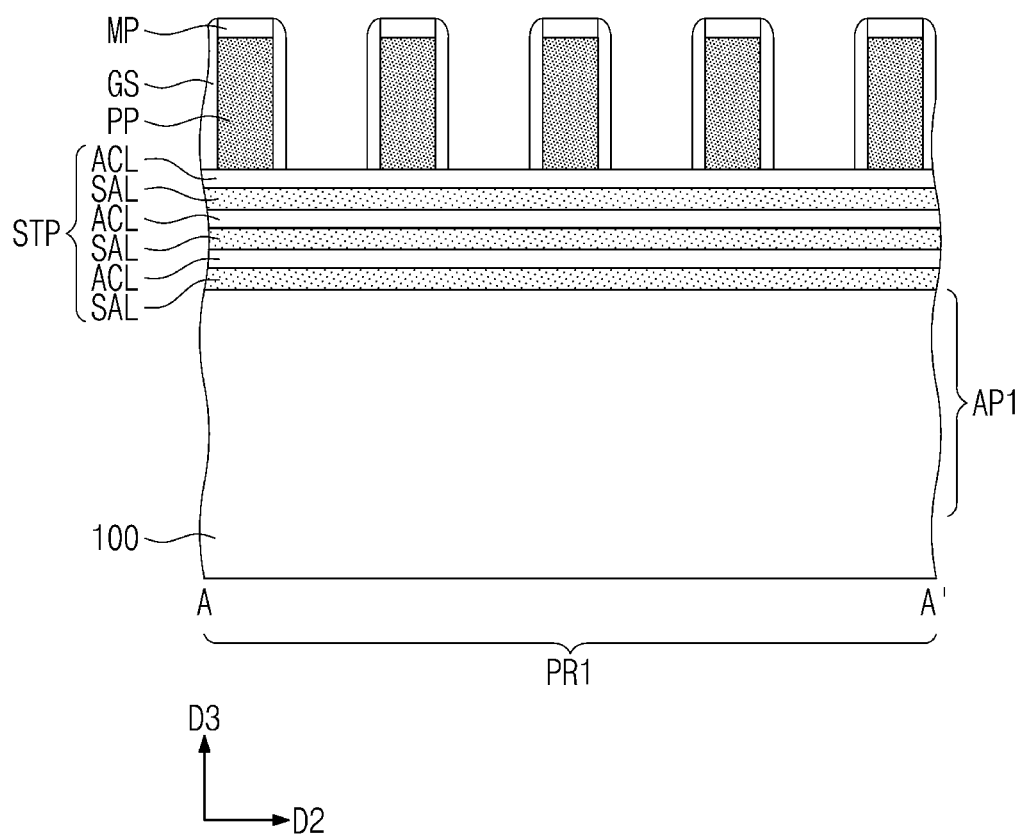
Figure 8B:
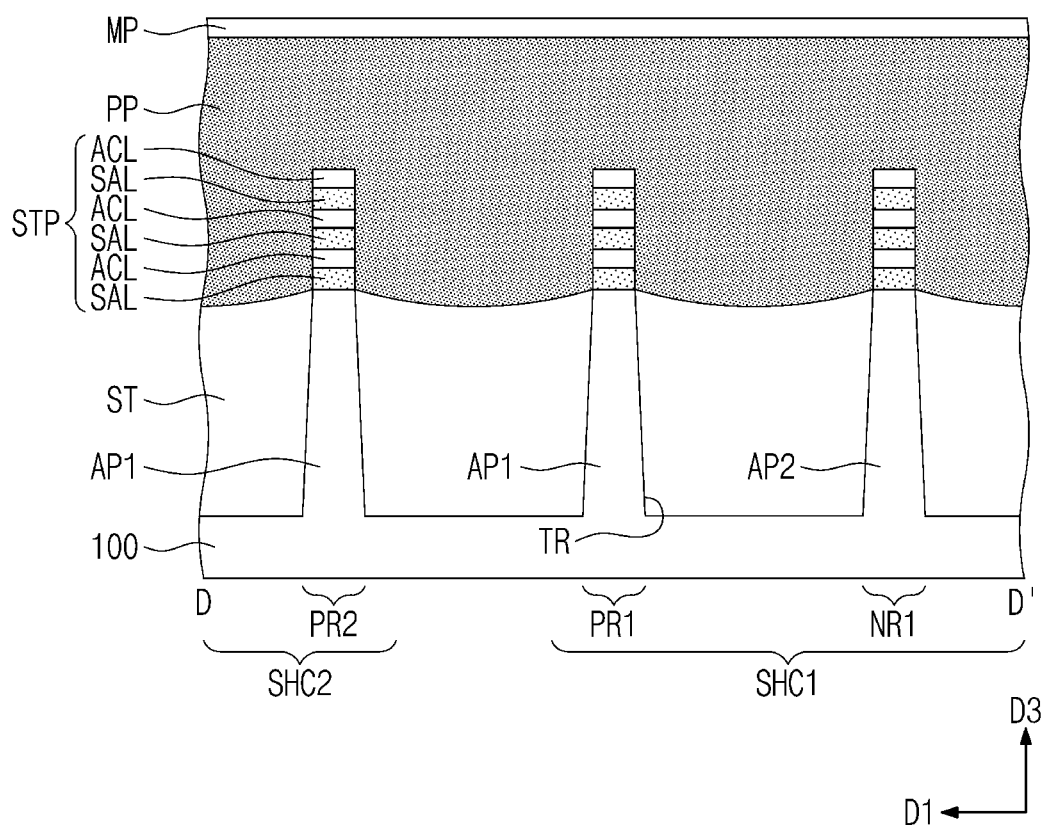
Figure 9A:
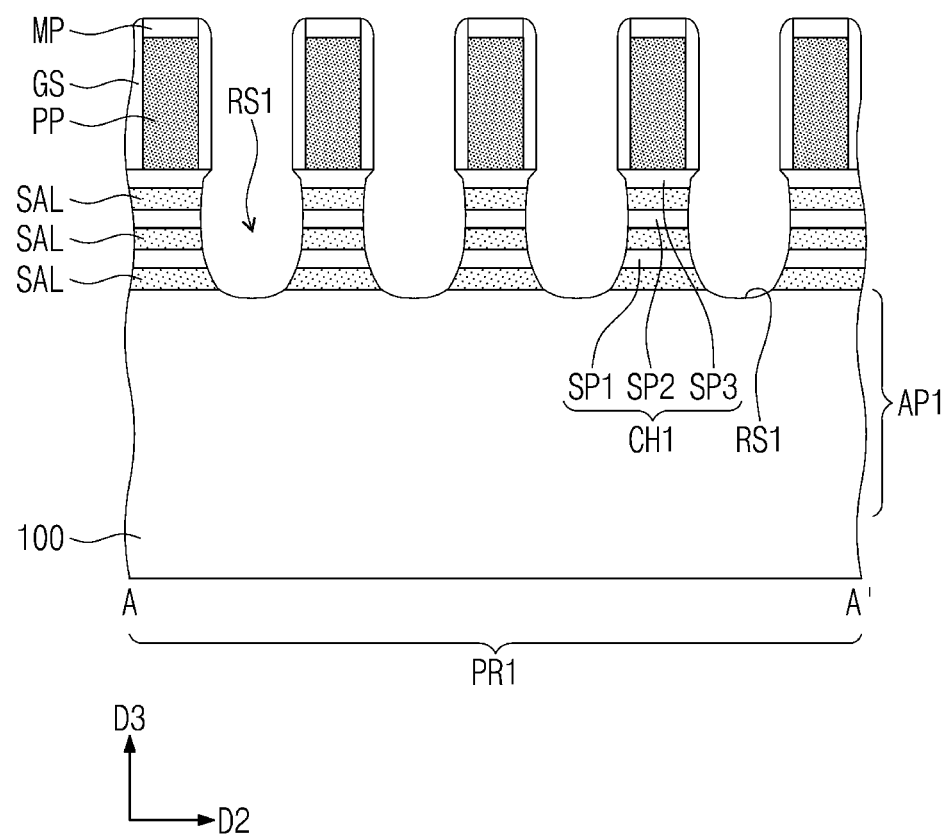
Figure 9B:
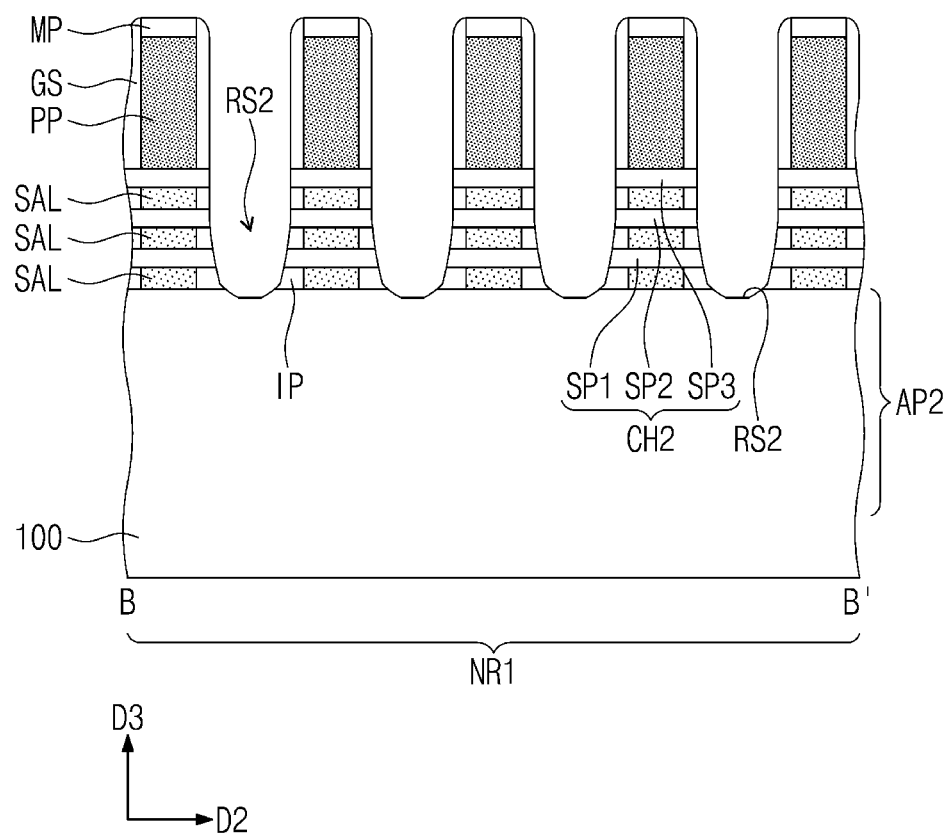
Figure 9C:
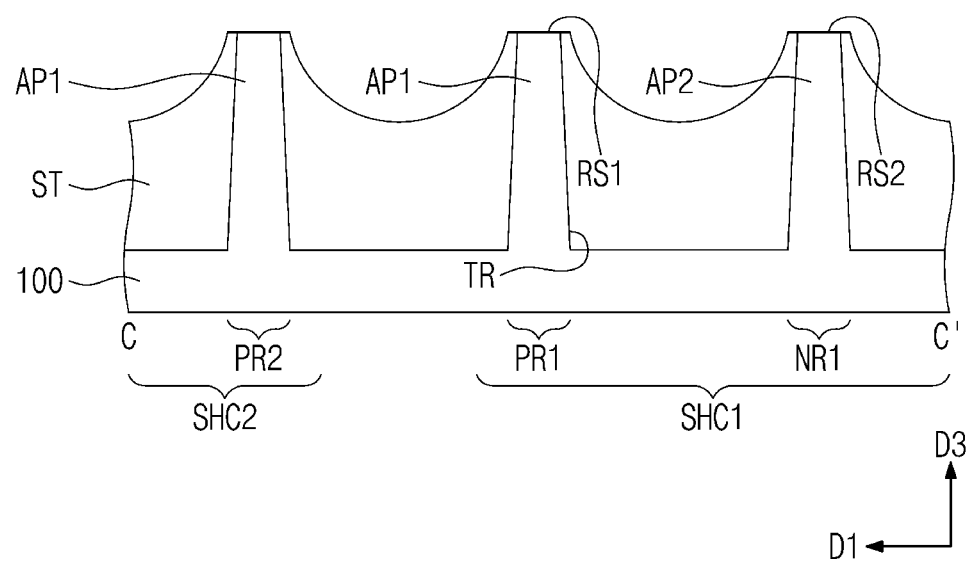
Figure 9D:
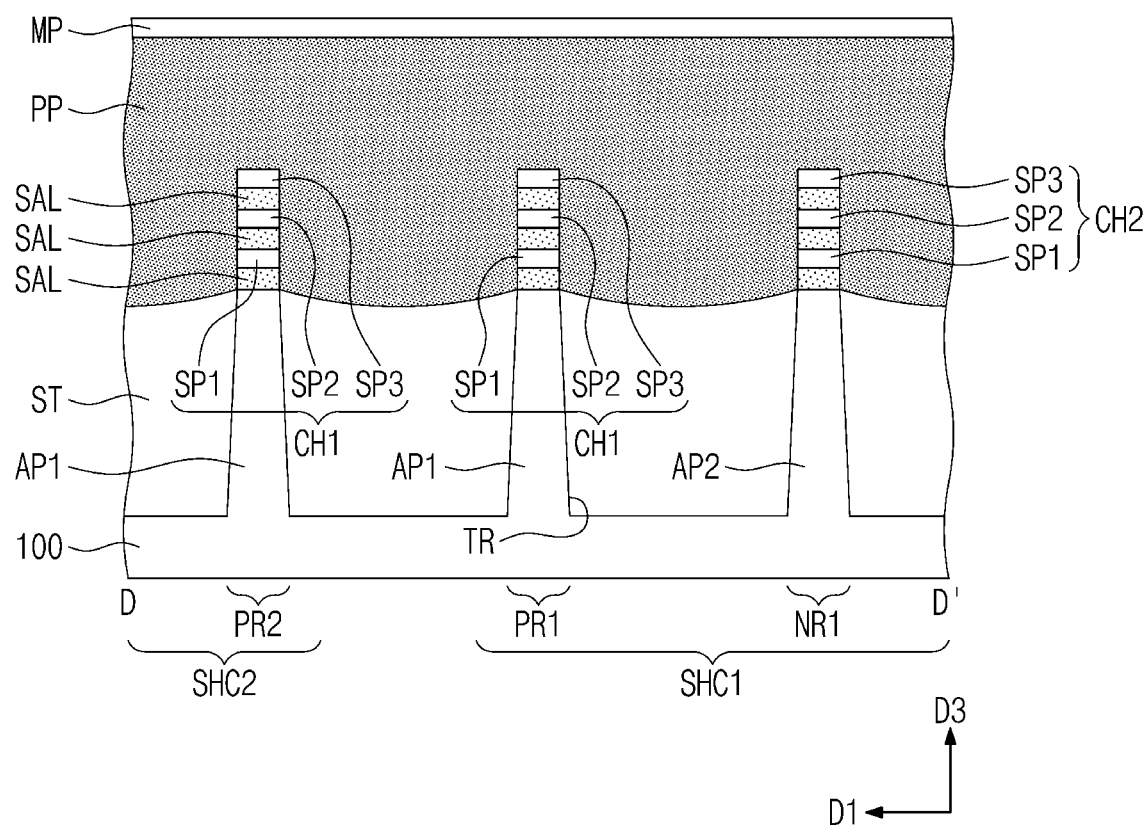
Figure 10A:
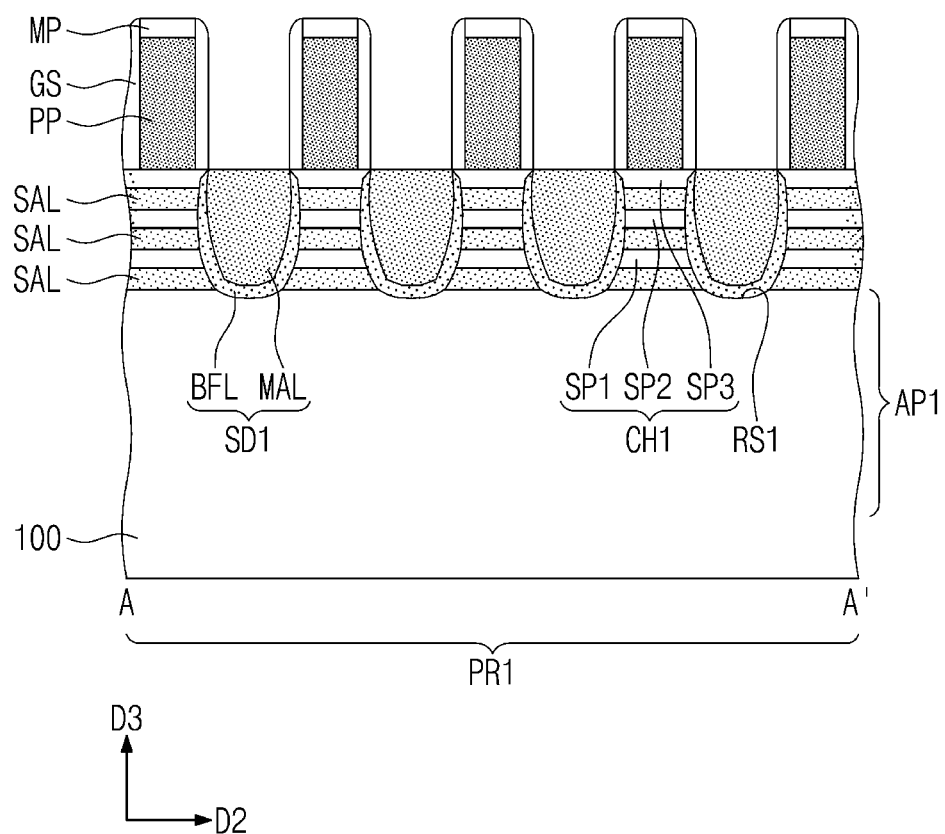
Figure 10B:
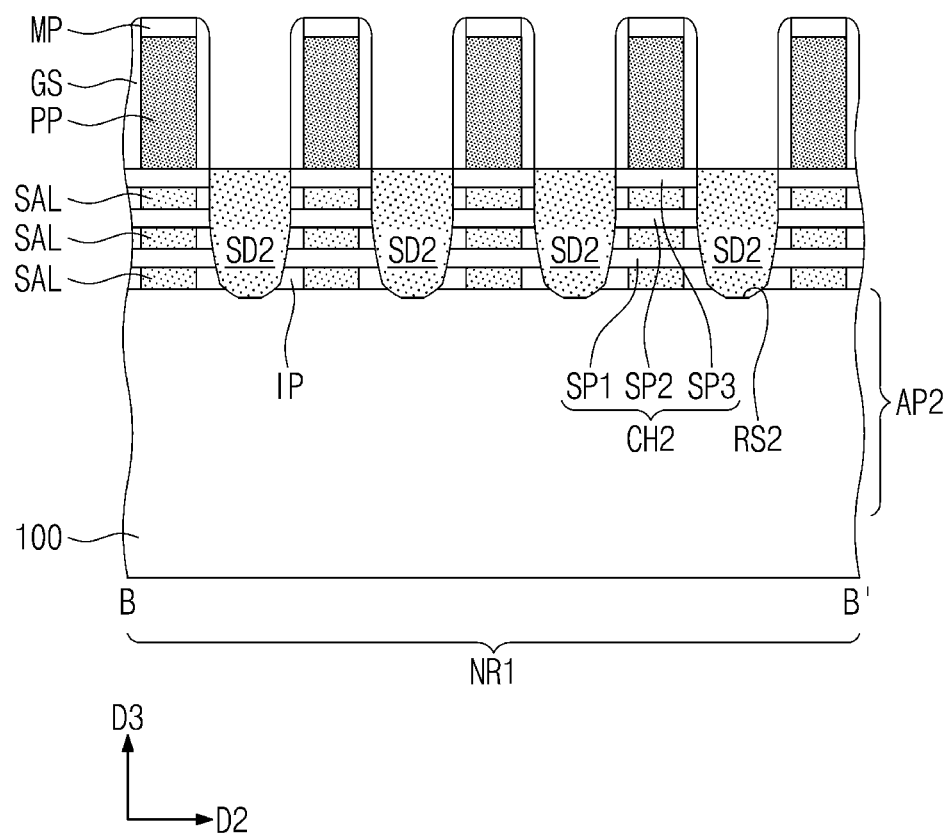
Figure 10C:
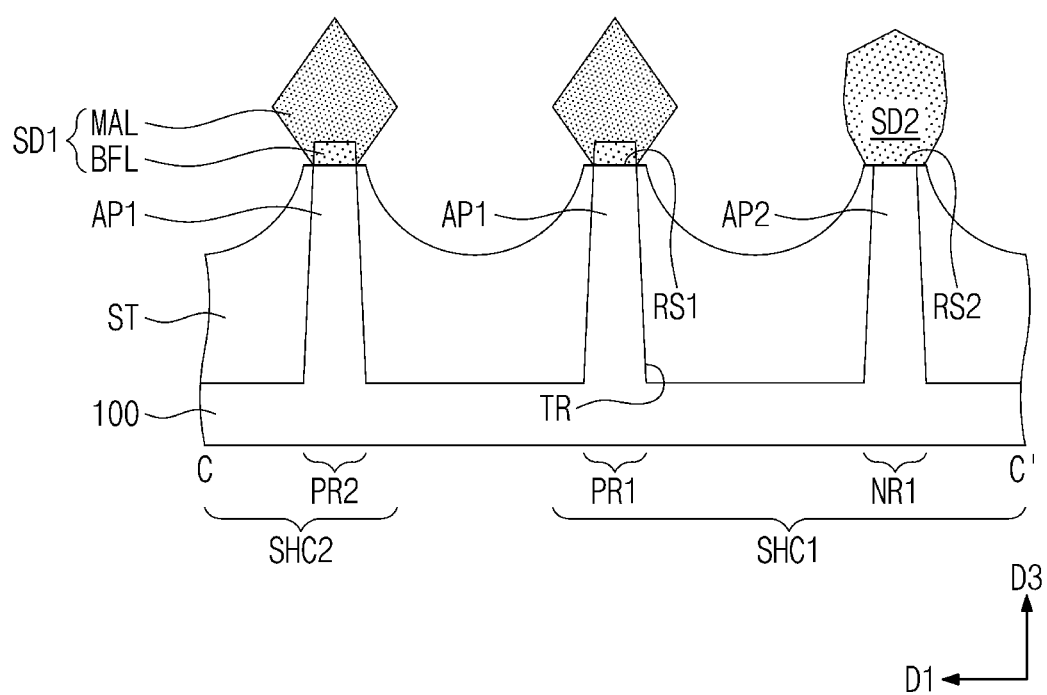
Figure 10D:
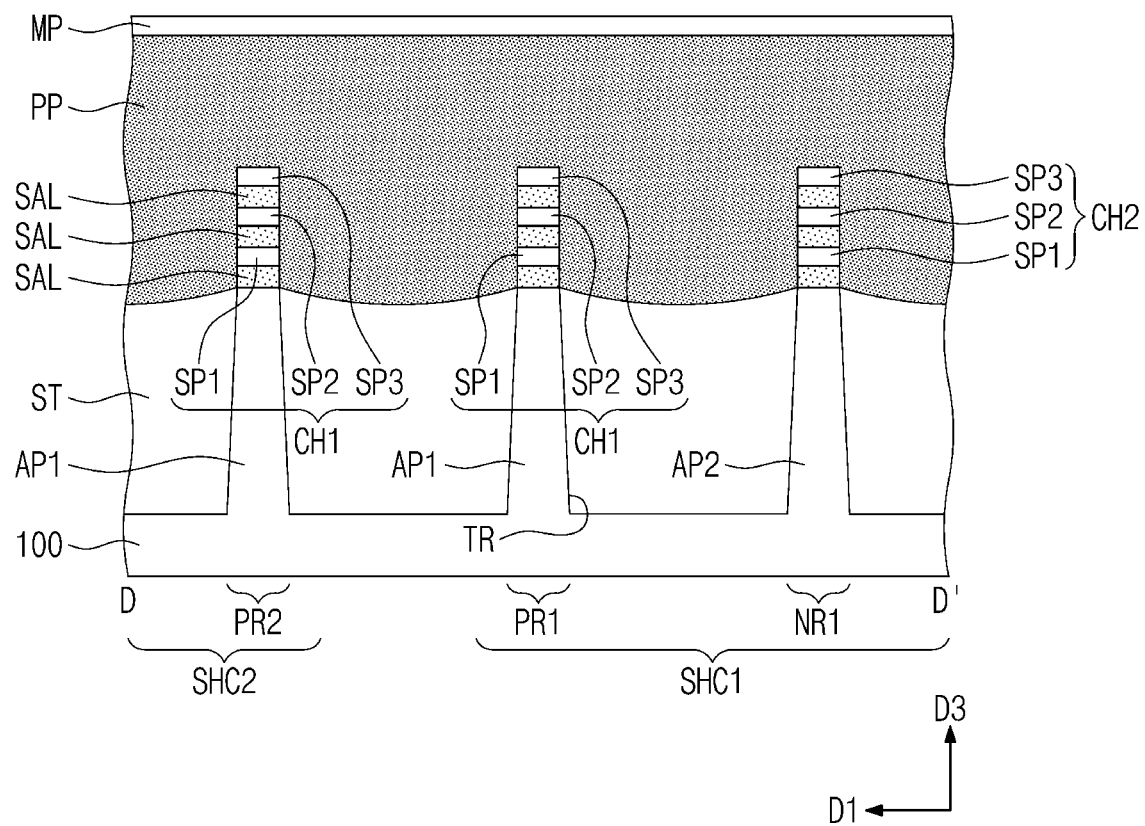
Figure 11A:
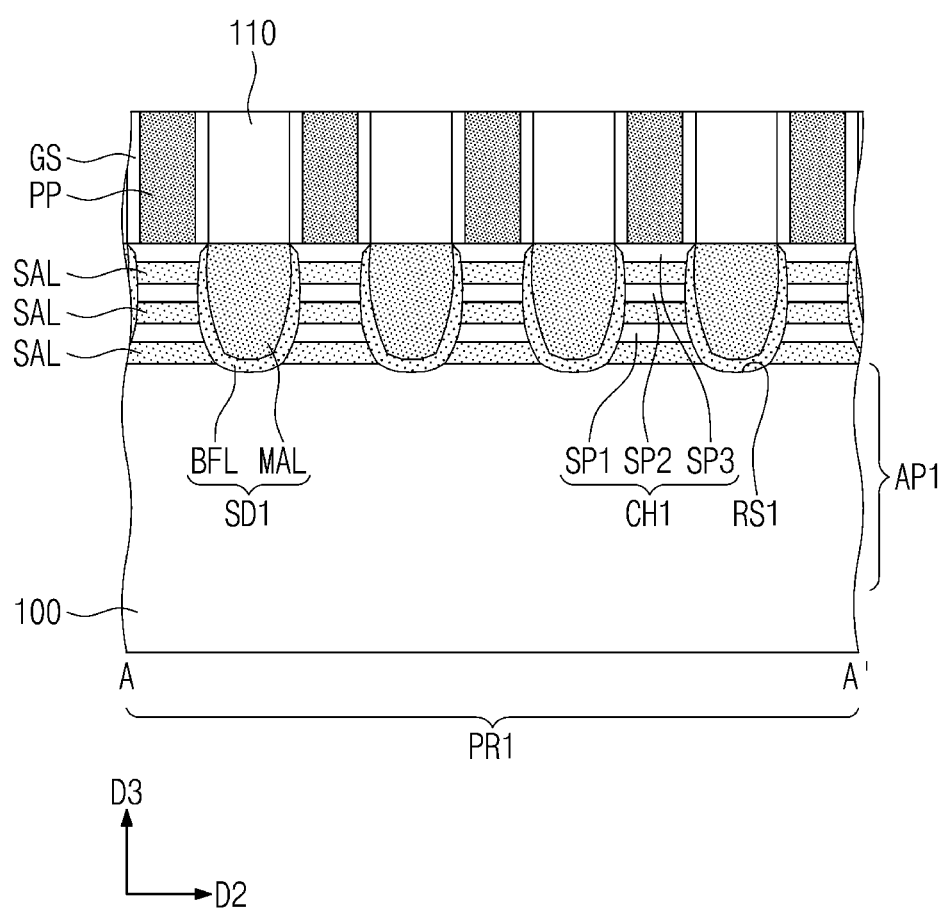
Figure 11B:
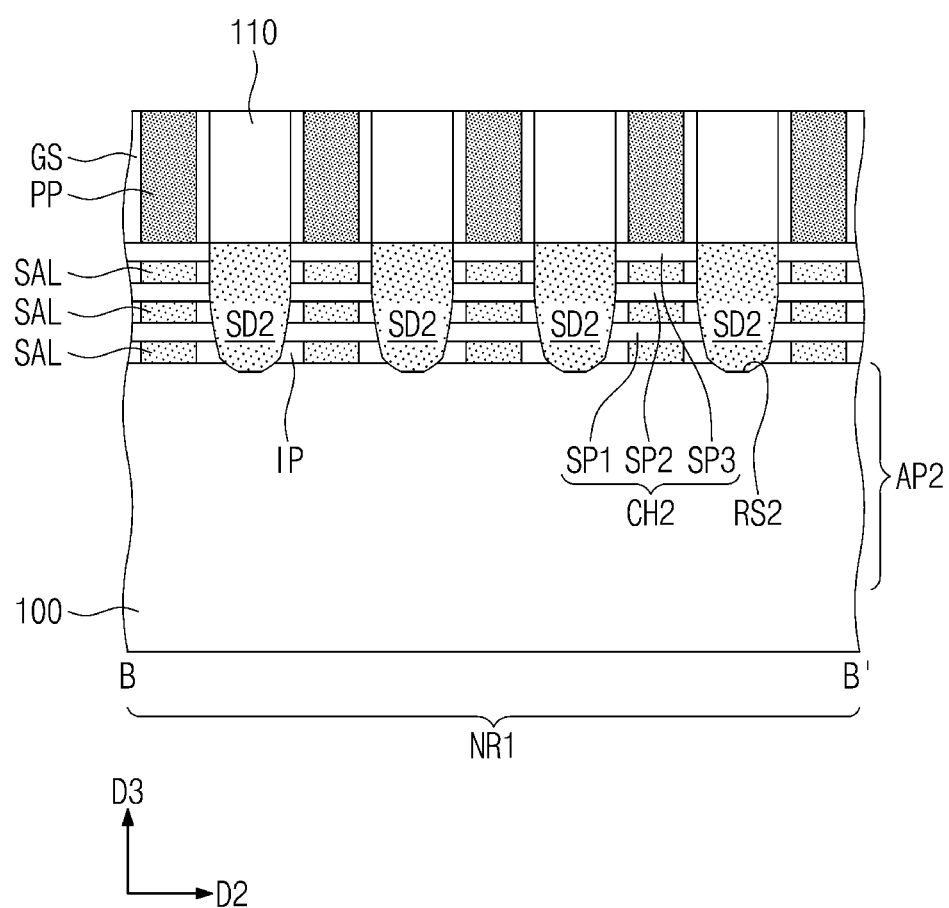
Figure 11C:
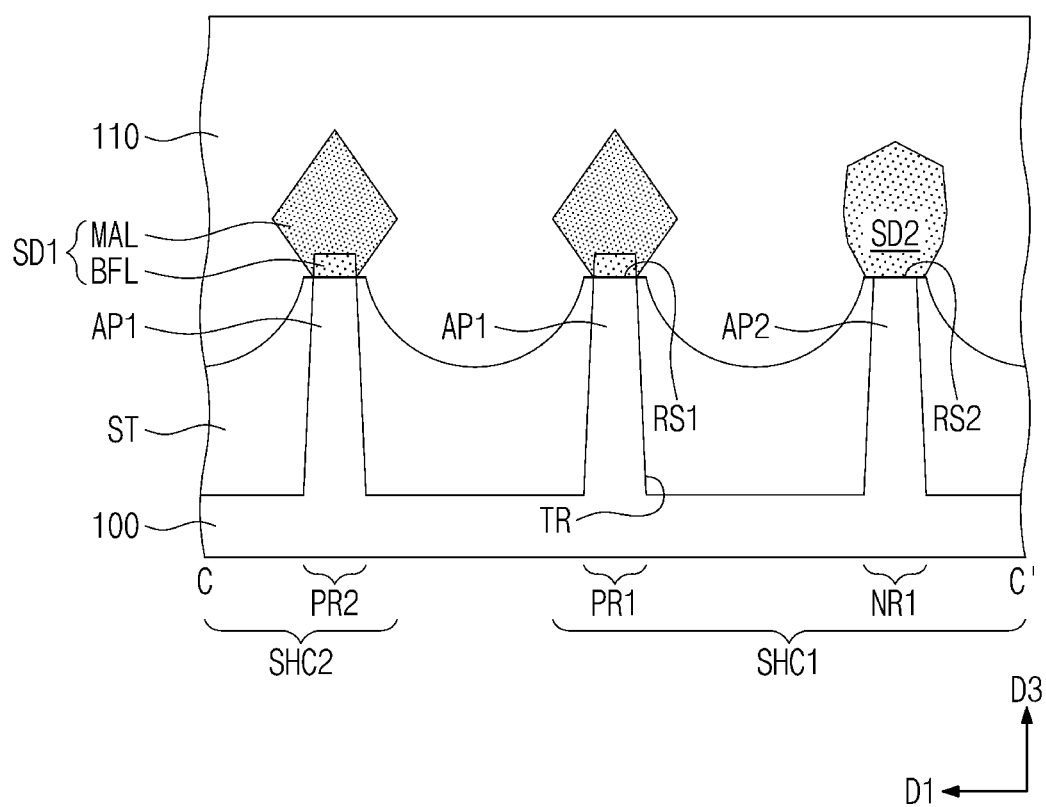
Figure 11D:
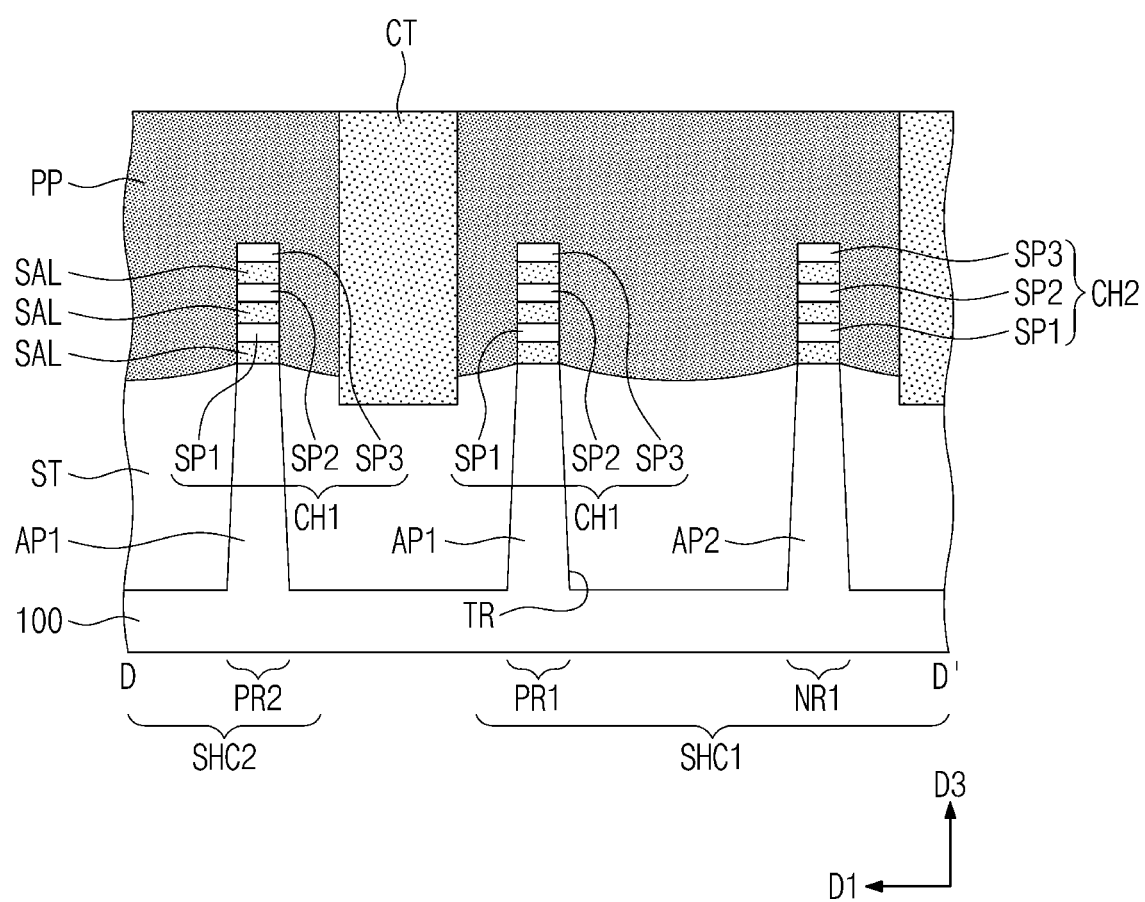

Referring to FIGS. 8A and 8B, sacrificial patterns PP may be formed on the substrate 100, running across the stack patterns STP. Each of the sacrificial patterns PP may be formed to have a linear or bar shape that extends in a first direction D1. The sacrificial patterns PP may be arranged at a first pitch along the second direction D2.

For example, the formation of the sacrificial patterns PP may include forming a sacrificial layer on the entire surface of the substrate 100, forming hardmask patterns MP on the sacrificial layer, and using the hardmask patterns MP as an etching mask to pattern the sacrificial layer. The sacrificial layer may include, for example, polysilicon.

A pair of gate spacers GS may be formed on opposing sidewalls of each of the sacrificial patterns PP. The formation of the gate spacers GS may include conformally forming a gate spacer layer on the entire surface of the substrate 100 and anisotropically etching the gate spacer layer. In some embodiments, the gate spacer GS may be a multiple layer including at least two layers.

Referring to FIGS. 9A, 9B, 9C and 9D, first recesses RS1 may be formed in the stack pattern STP on the first active pattern AP1. Second recesses RS2 may be formed in the stack pattern STP on the second active pattern AP2. During the formation of the first and second recesses RS1 and RS2, the device isolation layer ST may further be recessed on opposing sides of each of the first and second active patterns AP1 and AP2. (See, e.g., FIG. 9C).

For example, the hardmask patterns MP and the gate spacers GS may be used as an etching mask such that the stack pattern STP on the first active pattern AP1 may be etched to form the first recesses RS1. The first recess RS1 may be formed between a pair of sacrificial patterns PP.

The second recesses RS2 in the stack pattern STP on the second active pattern AP2 may be formed using the same method used for the formation of the first recesses RS1. The formation of the second recess RS2 may further include forming an inner spacer IP in a zone where the sacrificial layer SAL is recessed.

The active layers ACL may be formed into first, second, and third semiconductor patterns SP1, SP2, and SP3 that are sequentially stacked between neighboring first recesses RS1. The active layers ACL may be formed into first, second, and third semiconductor patterns SP1, SP2, and SP3 that are sequentially stacked between neighboring second recesses RS2. A first channel pattern CH1 may include the first, second, and third semiconductor patterns SP1, SP2, and SP3 between neighboring first recesses RS1. A second channel pattern CH2 may include the first, second, and third semiconductor patterns SP1, SP2, and SP3 between neighboring second recesses RS2.

Referring to FIGS. 10A, 10B, 10C and 10D, first source/drain patterns SD1 may be correspondingly formed in the first recesses RS1. For example, a first selective epitaxial growth (SEG) process may be performed in which an inner wall of the first recess RS1 is used as a seed layer to form a buffer layer BFL. The buffer layer BFL may be grown from a seed, or the substrate 100 and the first, second, and third semiconductor patterns SP1, SP2, and SP3 exposed by the first recess RS1. For example, the first SEG process may include chemical vapor deposition (CVD) or molecular beam epitaxy (MBE).

The buffer layer BFL may include a semiconductor element (e.g., SiGe) whose lattice constant is greater than that of a semiconductor element of the substrate 100. In some embodiments, the buffer layer BFL may contain germanium (Ge) at a relatively low concentration. Here, the germanium concentration of the buffer layer BFL may range from about 0 at % to about 10 at %. Alternately, the buffer layer BFL may not include germanium (Ge), but instead may include only silicon (Si).

The buffer layer BFL may undergo a second SEG process to form a main layer MAL. The main layer MAL may be formed to completely fill the first recess RS1. The main layer MAL may contain germanium (Ge) having a relatively high concentration (e.g., ranging from about 30 at % to about 70 at %).

During the formation of the buffer layer BFL and the main layer MAL, impurities (e.g., boron, gallium, and/or indium) may be in-situ implanted to allow the first source/drain pattern SD1 to have a P-type conductivity. Alternately, after the formation of the first source/drain pattern SD1, impurities may be implanted into the first source/drain pattern SD1.

Second source/drain patterns SD2 may be correspondingly formed in the second recesses RS2. For example, a third selective epitaxial growth (SEG) process may be performed in which an inner wall of the second recess RS2 is used as a seed to form second source/drain pattern SD2. For example, the second source/drain pattern SD2 may include the same semiconductor element (e.g., Si) as that of the substrate 100.

During the formation of the second source/drain pattern SD2, impurities (e.g., phosphorus, arsenic, or antimony) may be in-situ implanted to allow the second source/drain pattern SD2 to have an N-type conductivity. Alternately, after the formation of the second source/drain pattern SD2, impurities may be implanted into the second source/drain pattern SD2.

Referring to FIGS. 11A, 11B, 11C and 11D, a first interlayer dielectric layer 110 may be formed to cover the first and second source/drain patterns SD1 and SD2, the hardmask patterns MP, and the gate spacers GS. For example, the first interlayer dielectric layer 110 may include a silicon oxide layer.

The first interlayer dielectric layer 110 may be planarized until top surfaces of the sacrificial patterns PP are exposed. An etch-back or chemical mechanical polishing (CMP) process may be employed to planarize the first interlayer dielectric layer 110. The hardmask patterns MP may all be removed during the planarization process. As a result, the first interlayer dielectric layer 110 may have a top surface coplanar with those of the sacrificial patterns PP and those of the gate spacers GS.

A photolithography process may be used to selectively open one region of the sacrificial pattern PP. For example, it may be possible to selectively open a portion of the sacrificial pattern PP on the third and fourth boundaries BD3 and BD4 of the first single height cell SHC1. The opened portion of the sacrificial pattern PP may be selectively etched and removed. A space where the sacrificial pattern PP is removed may be filled with a dielectric material to form a gate cutting pattern CT.

Referring to FIGS. 12A, 12B, 12C and 12D, the exposed sacrificial patterns PP may be selectively removed. The removal of the sacrificial patterns PP may form an outer region ORG that exposes the first and second channel patterns CH1 and CH2 (See, e.g., FIG. 12D). The removal of the sacrificial patterns PP may include performing a wet etching process using an etchant that selectively etches polysilicon.

The sacrificial layers SAL exposed through the outer region ORG may be selectively removed to form inner regions IRG. (See, e.g., FIG. 12D). For example, an etching process that selectively etches the sacrificial layers SAL may be performed such that only the sacrificial layers SAL may be removed while leaving the first, second, and third semiconductor patterns SP1, SP2, and SP3. The etching process may have a high etch rate with respect to silicon-germanium having a relatively high germanium concentration. For example, the etching process may have a high etch rate with respect to silicon-germanium whose germanium concentration is greater than about 10 at %.

During the etching process, the sacrificial layers SAL may be removed from the first and second PMOSFET regions PR1 and PR2 and from the first and second NMOSFET regions NR1 and NR2. The etching process may be a wet etching process. An etching material used for the etching process may promptly etch the sacrificial layer SAL whose germanium concentrate is relatively high. During the etching process, the first source/drain pattern SD1 on the first and second PMOSFET regions PR1 and PR2 may be protected by the buffer layer BFL whose germanium concentration is relatively low.

Figure 12A:
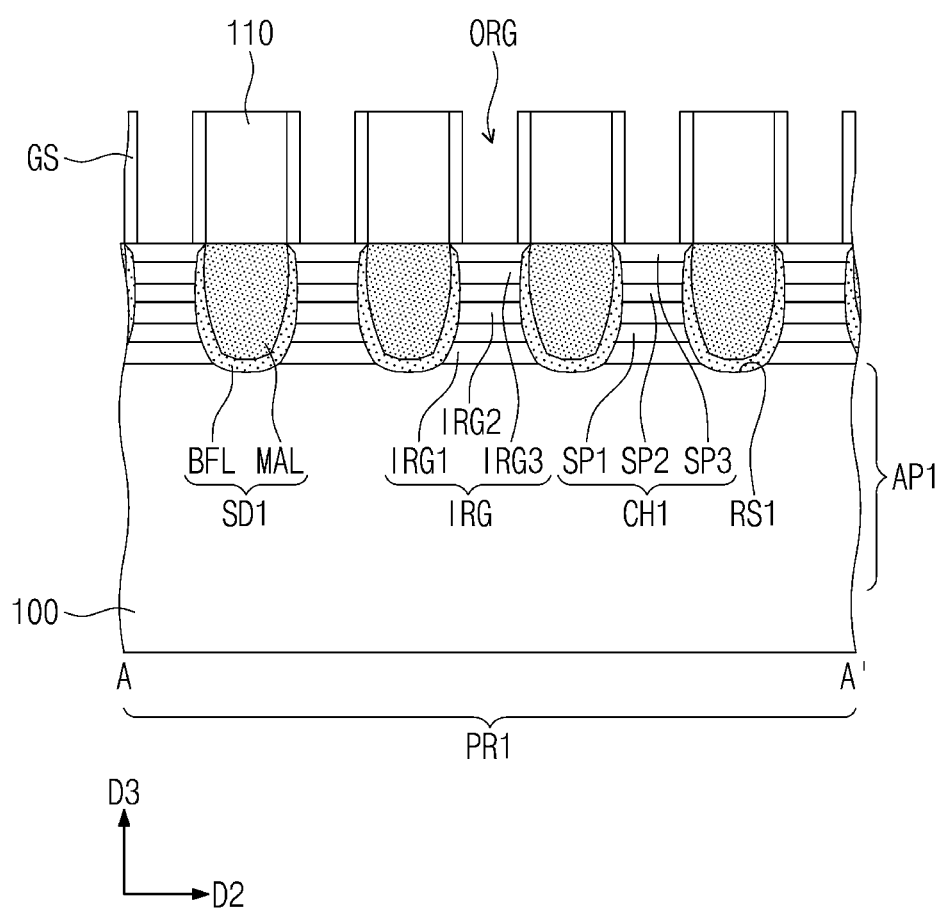
Figure 12B:
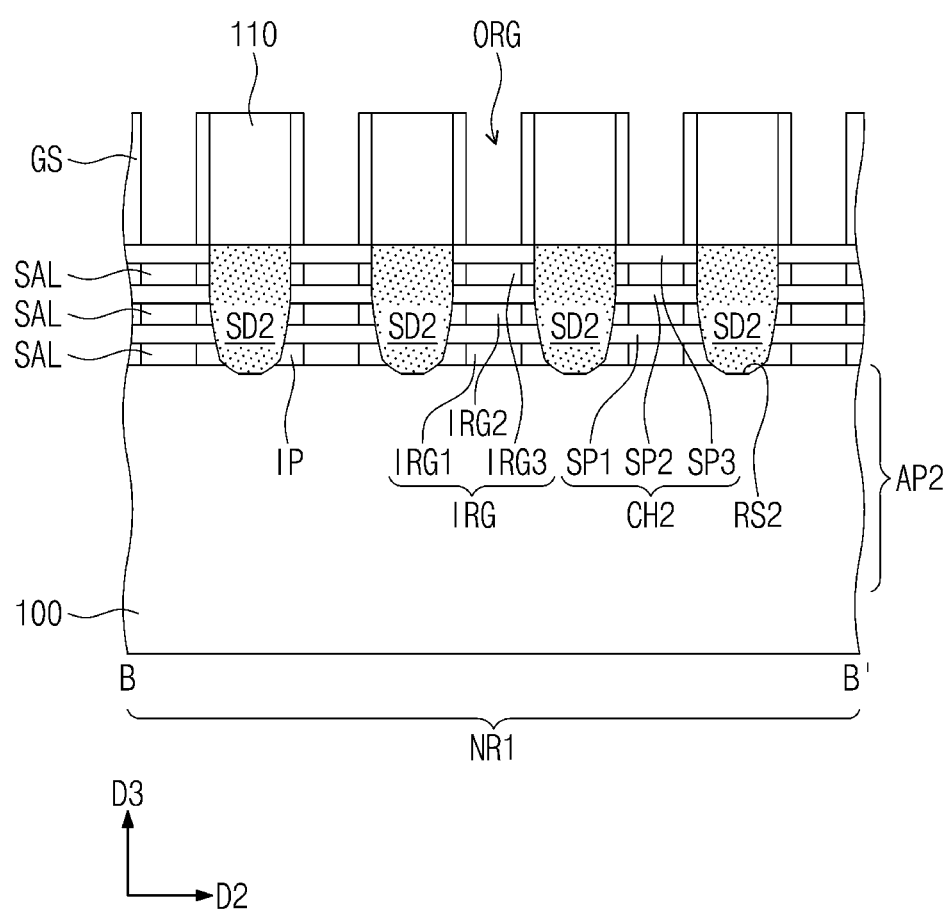
Figure 12C:
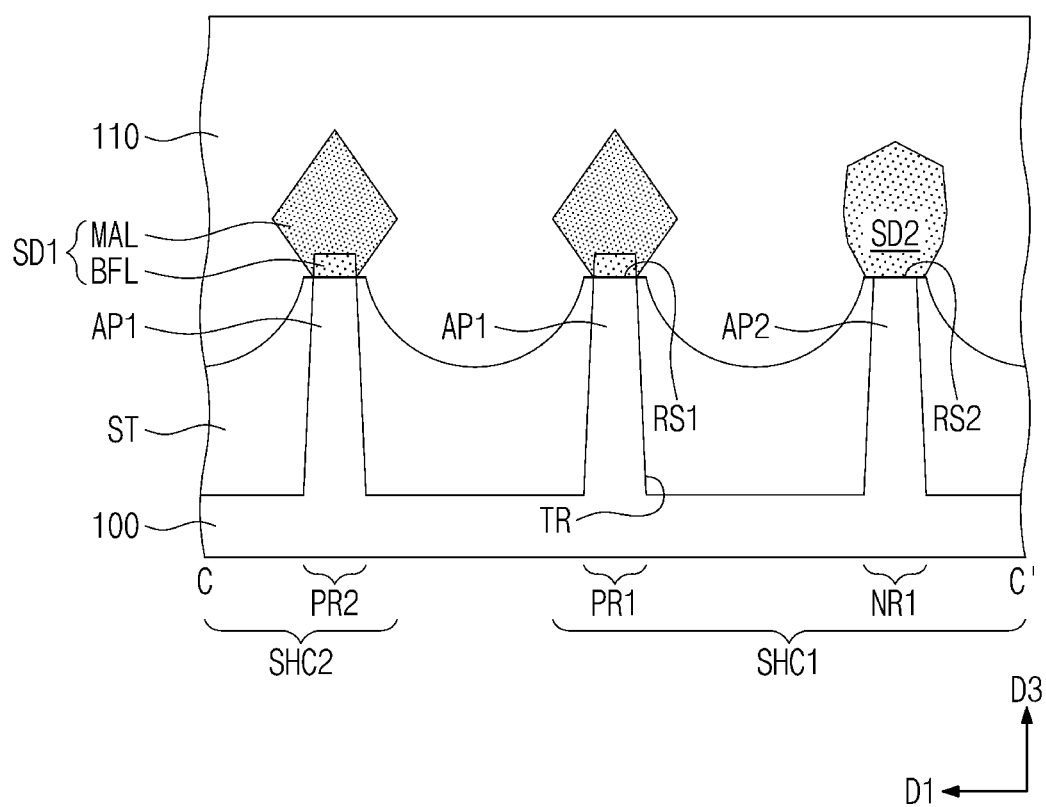
Figure 12D:
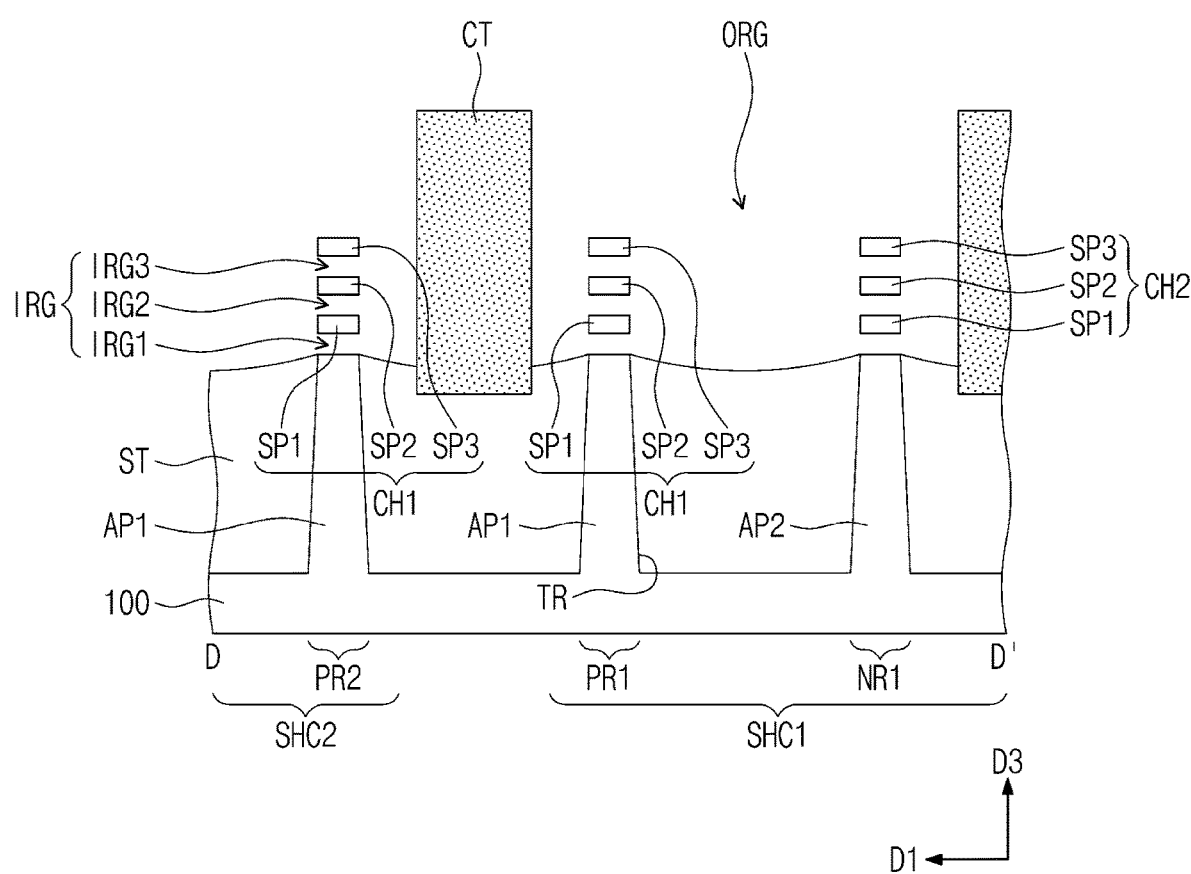
Figure 13A:
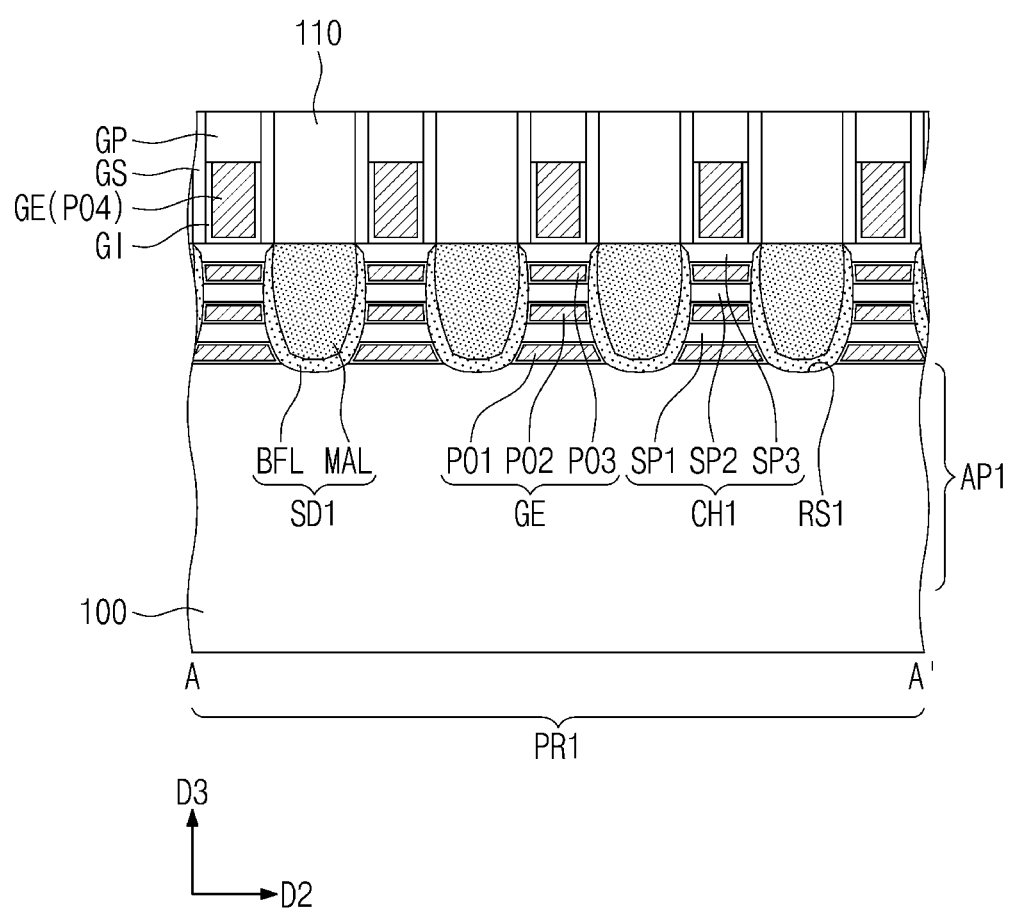
Figure 13B:
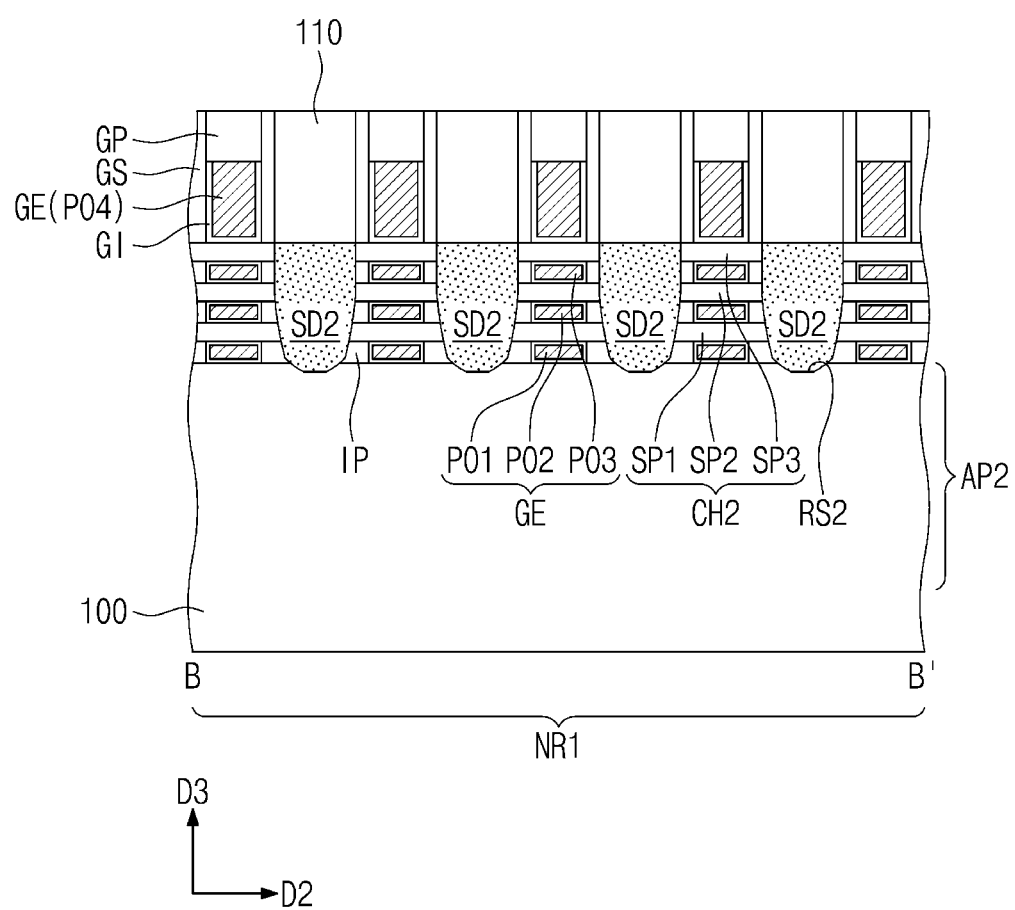
Figure 13C:
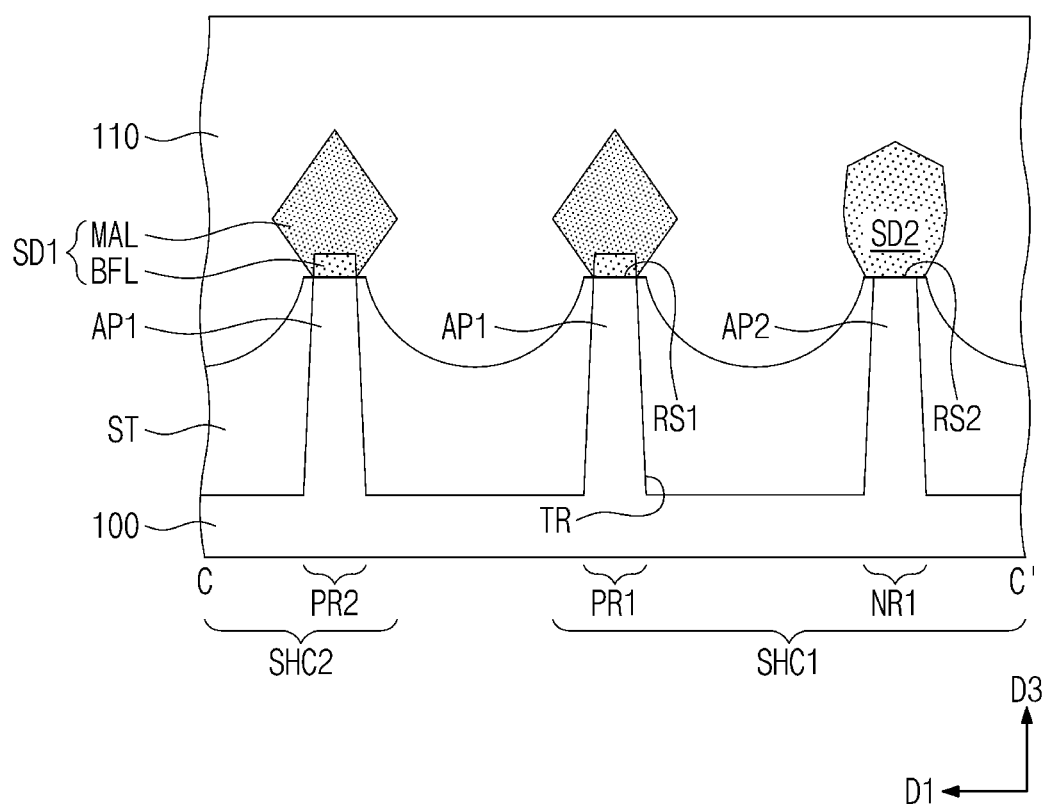
Figure 13D:
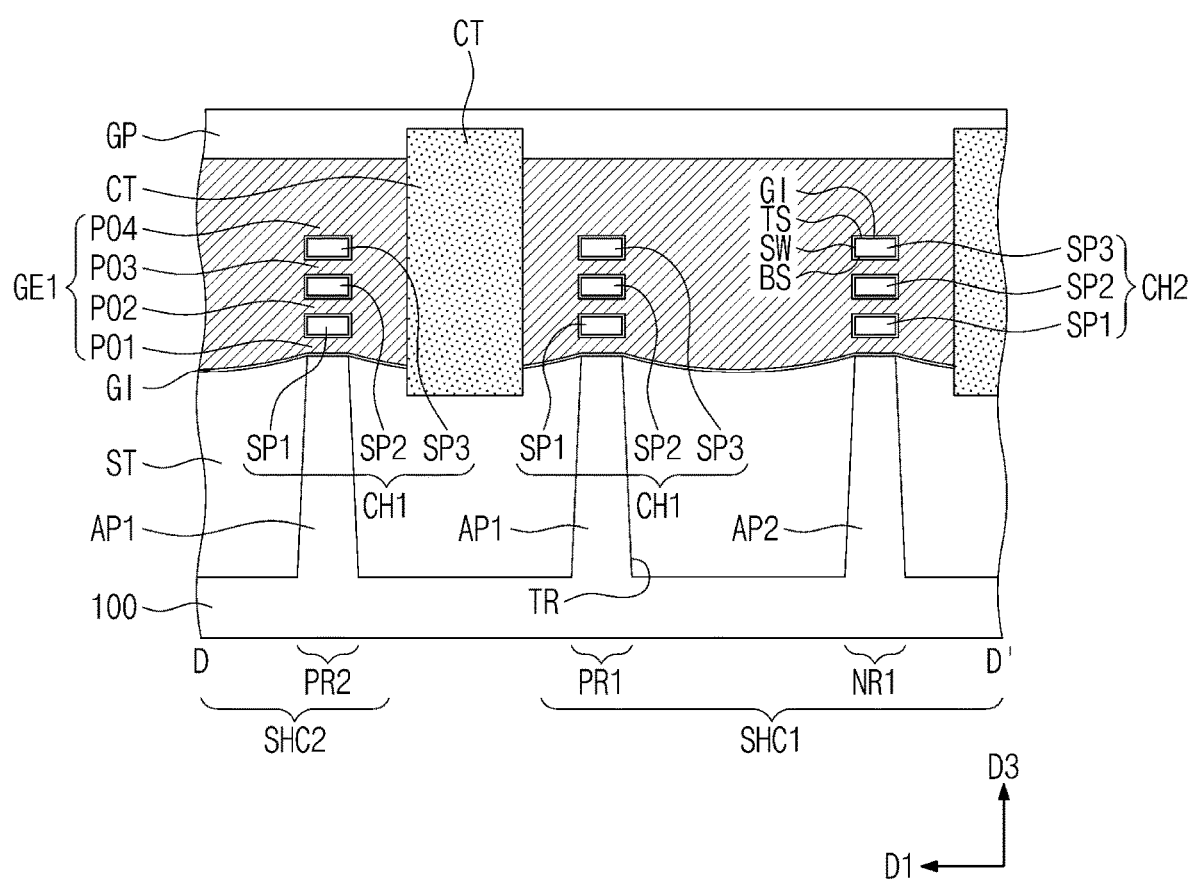

Referring to FIG. 12D, as the sacrificial layers SAL are selectively removed, the stacked first, second, and third semiconductor patterns SP1, SP2, and SP3 may remain on each of the first and second active patterns AP1 and AP2. The removal of the sacrificial layers SAL may form first, second, and third inner regions IRG1, IRG3, and IRG3.

For example, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring to FIGS. 13A, 13B, 13C and 13D, a gate dielectric layer GI may be conformally formed on the first, second, and third semiconductor patterns SP1, SP2, and SP3 that are exposed. A gate electrode GE may be formed on the gate dielectric layer GI. The gate electrode GE may include first, second, and third inner electrodes PO1, PO2, and PO3 that are respectively formed in the first, second, and third inner regions IRG1, IRG2, and IRG3, and may also include an outer electrode PO4 formed in the outer region ORG.

The gate electrode GE may be recessed to have a reduced height. While the gate electrode GE is recessed, an upper portion of the gate cutting pattern CT may also be slightly recessed. A gate capping pattern GP may be formed on the recessed gate electrode GE.

Referring to FIGS. 14A, 14B, 14C and 14D, a second interlayer dielectric layer 120 may be formed on the first interlayer dielectric layer 110. The second interlayer dielectric layer 120 may include a silicon oxide layer. Active contacts AC may be formed to penetrate the second and first interlayer dielectric layers 120 and 110 to come into electrical connection with the first and second source/drain patterns SD1 and SD2.

The formation of the active contact AC may include forming a barrier metal BM and forming a fill metal FM on the barrier metal BM. The barrier metal BM may be conformally formed and may include a metal layer and a metal nitride layer. The fill metal FM may include metal whose resistance is low.

A pair of separation structures DB may be formed on opposing sides of each of the first and second single height cells SHC1 and SHC2. The separation structure DB may extend from the second interlayer dielectric layer 120 through the gate electrode GE into the active pattern AP1 or AP2. The separation structure DB may include a dielectric material, such as a silicon oxide layer or a silicon nitride layer.

A third interlayer dielectric layer 130 may be formed on the second interlayer dielectric layer 120. A gate contact GC may be formed to penetrate the third interlayer dielectric layer 130, the second interlayer dielectric layer 120, and the gate capping pattern GP to come into connection with the gate electrode GE. A first via VI1 may be formed to penetrate the third interlayer dielectric layer 130 to come into connection with the active contact AC. The gate contact GC and the first via VI1 may be formed together.

Referring again to FIGS. 4, 5A, 5B, 5C and 5D, a first metal layer M1 may be formed in the third interlayer dielectric layer 130. For example, lines M1_R1, M1_R2, M1_R3, and M1_I may be formed in an upper portion of the third interlayer dielectric layer 130, correspondingly connected to the gate contact GC and the first via VIE A fourth interlayer dielectric layer 140 may be formed on the third interlayer dielectric layer 130. A second metal layer M2 may be formed in the fourth interlayer dielectric layer 140.

Figure 14A:
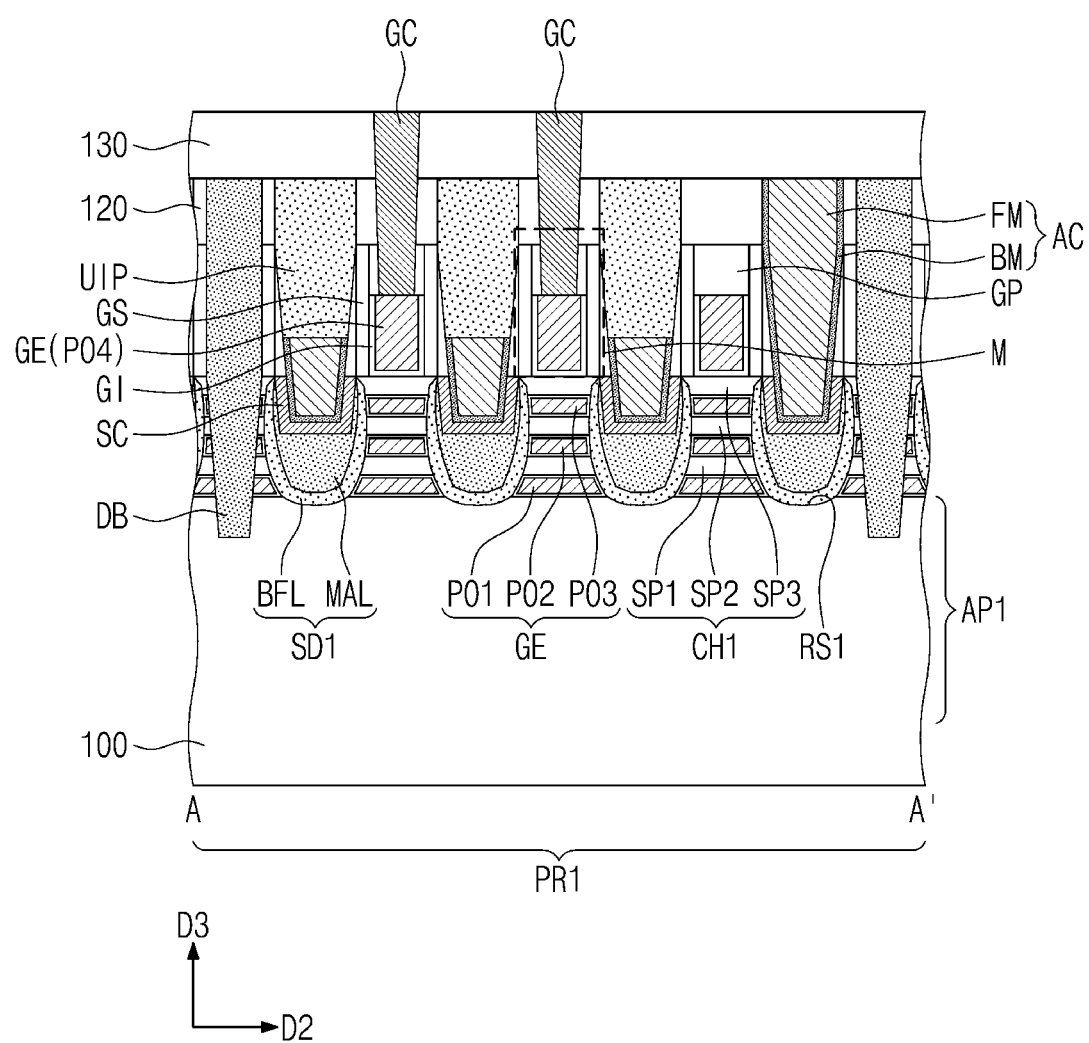
Figure 14B:
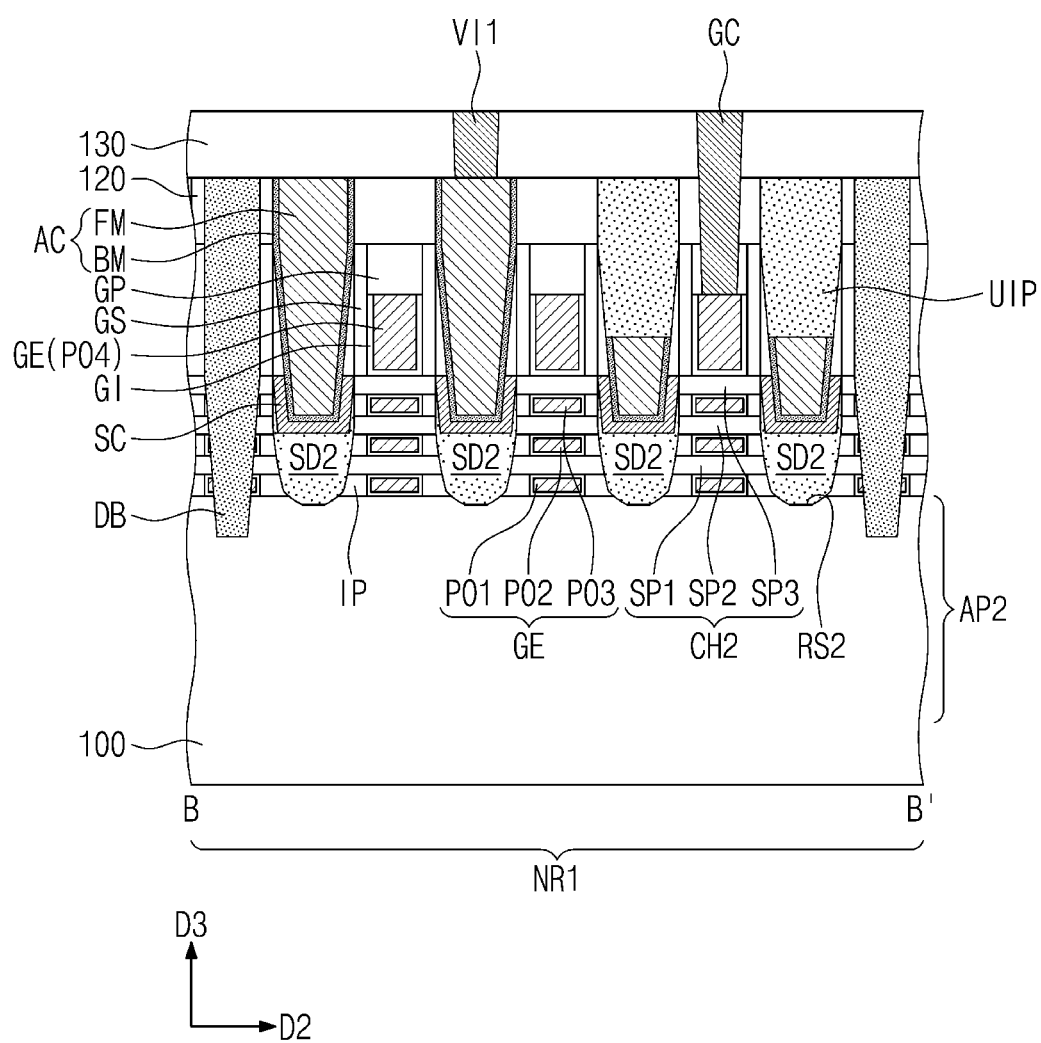
Figure 14C:
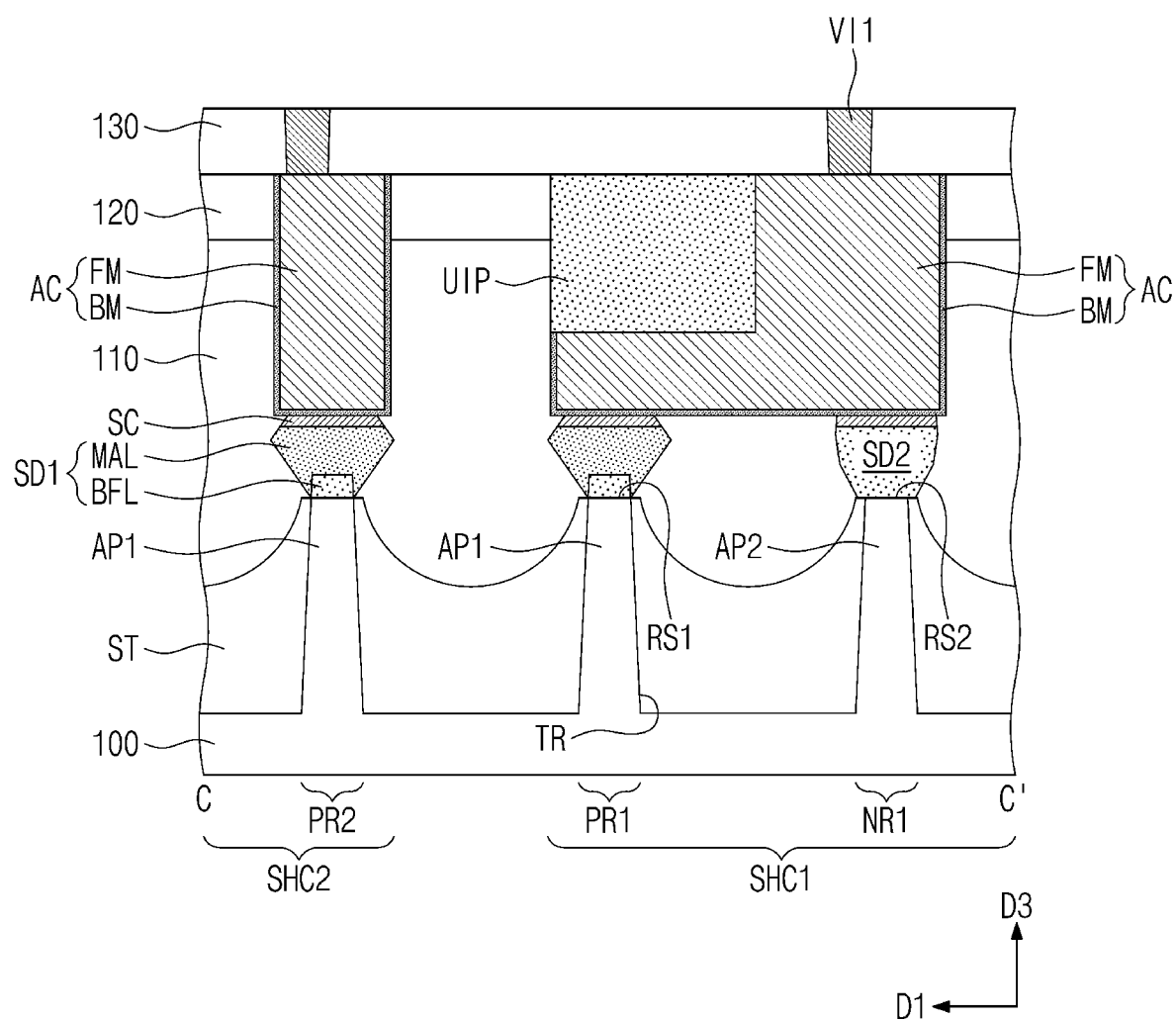
Figure 14D:
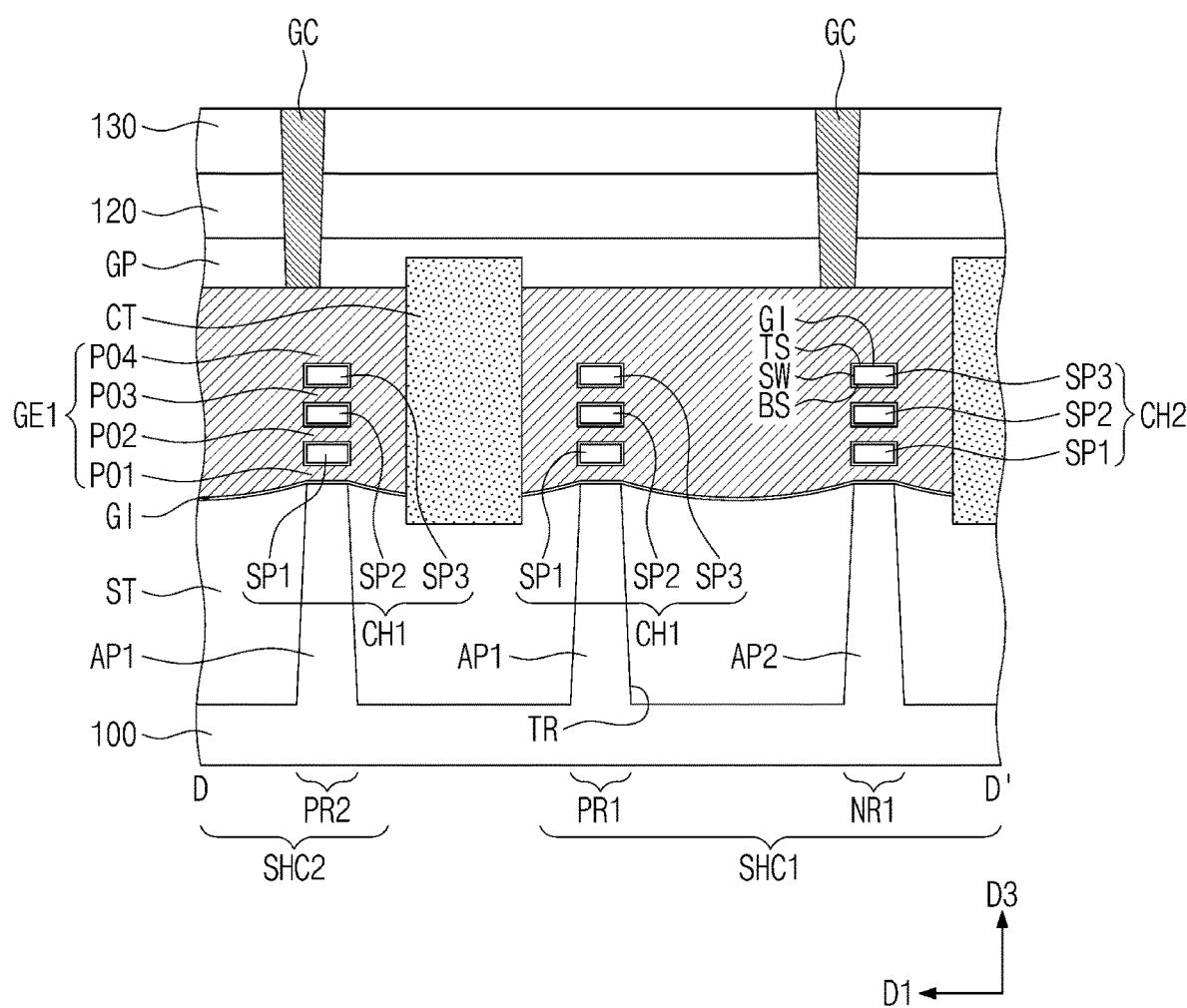
Figure 15:
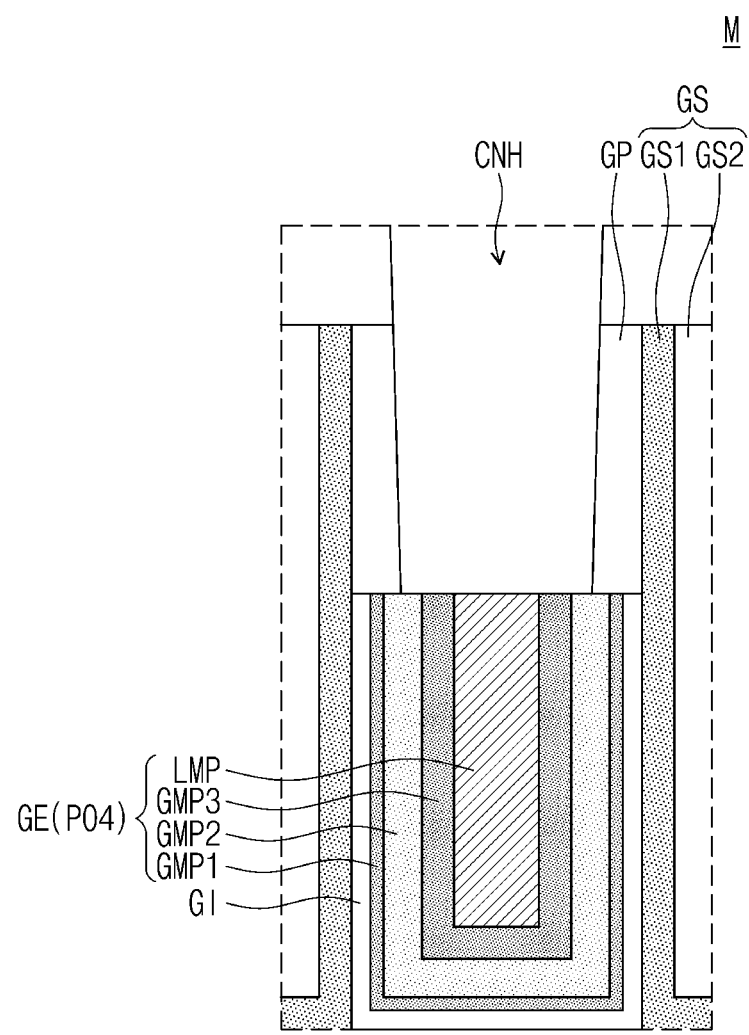
FIGS. 15, 16 and 17 are respective, enlarged cross-sectional views further illustrating region 'M' indicated in FIG. 14A.
Figure 16:
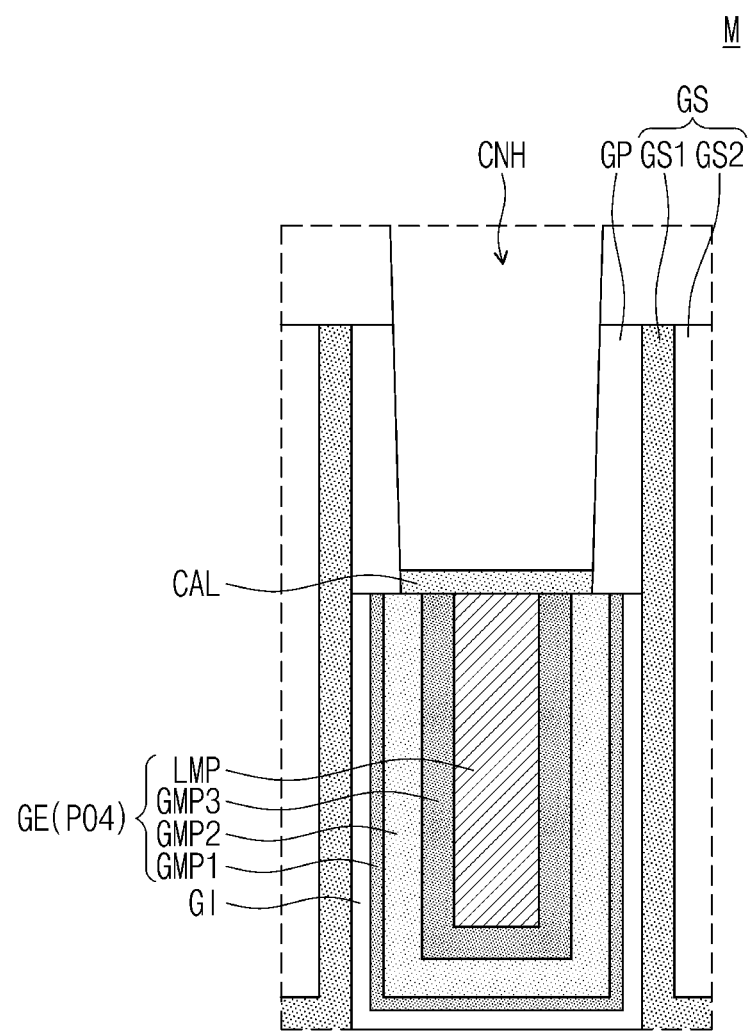
Figure 17:
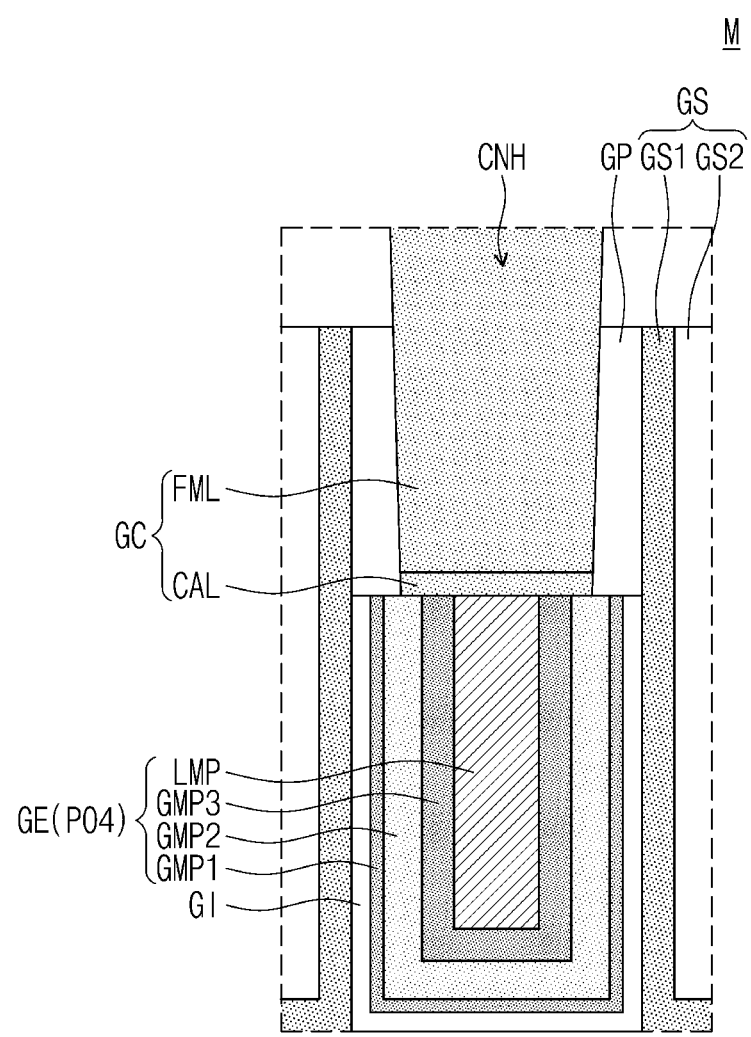

FIGS. 15, 16 and 17 are respective enlarged cross-sectional views of region 'M' indicated in FIG. 14A and serve to further illustrate the formation of a gate contact within a method of fabricating semiconductor devices according to embodiments of the inventive concept.

Referring to FIG. 15, a contact hole CNH may be formed to penetrate the gate capping pattern GP. For example, the contact hole CNH may expose a top surface of the gate electrode GE.

Referring to FIG. 16, a capping layer CAL may be formed in a lower portion of the contact hole CNH. The capping layer CAL may be formed to directly cover the exposed top surface of the gate electrode GE. The formation of the capping layer CAL may include performing an atomic layer deposition (ALD) process using a first metal precursor that contains no oxygen atom. For example, the first metal precursor may include $MoCl_5$. As a result, the capping layer CAL may include molybdenum (Mo) as a primary constituent.

Since the first metal precursor includes no oxygen atom, the capping layer CAL may have a relatively low oxygen concentration. The first metal precursor may prevent a metal oxidation layer from being formed at an interface between the capping layer CAL and the gate electrode GE.

Referring to FIG. 17, a metal layer FML may be formed on the capping layer CAL, filling the contact hole CNH. The formation of the metal layer FML may include performing an ALD process using a second metal precursor that contains an oxygen atom. For example, the second metal precursor may include $MoO_2Cl_2$. As a result, similar to the capping layer CAL, the metal layer FML may include molybdenum (Mo) as a primary constituent material.

In some embodiments, the metal layer FML may include first crystal regions each having a first crystal structure (e.g., body centered cubic (BCC) structure) and second crystal regions each having a second crystal structure (e.g., face centered cubic (FCC) structure). Here, the crystal structure and grain size of the metal layer FML may be substantially similar to that previously described with reference to FIG. 6.

Figure 18A:
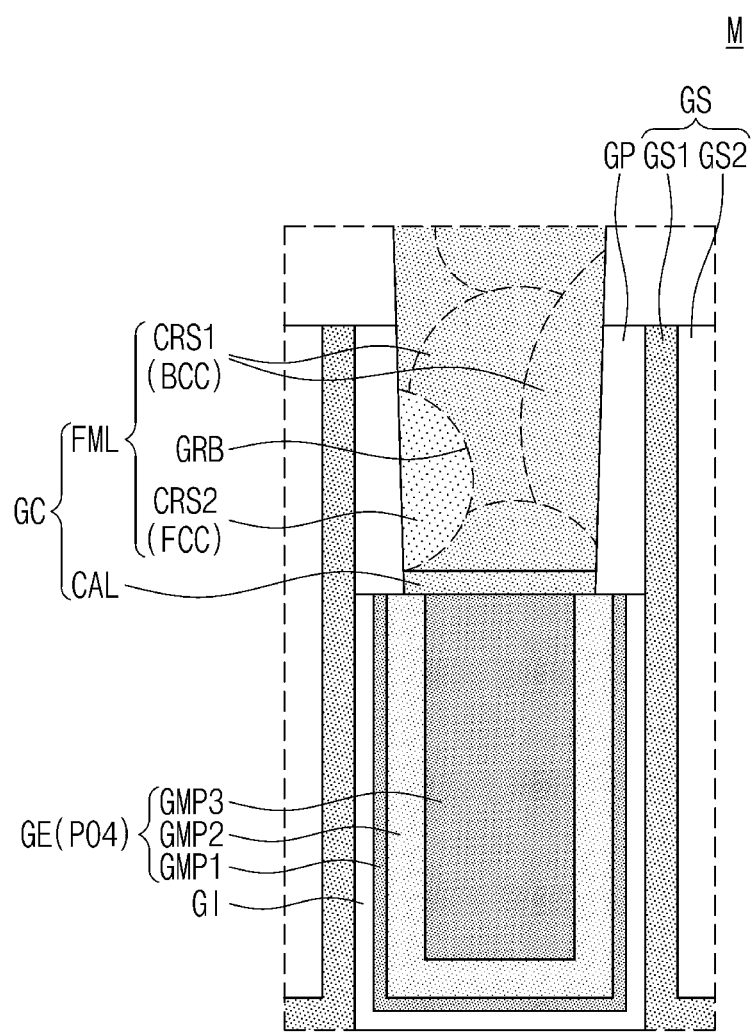
FIGS. 18A, 18B, and 18C are respective, enlarged cross-section views further illustrating region 'M' indicated in FIG. 5A.
Figure 18B:
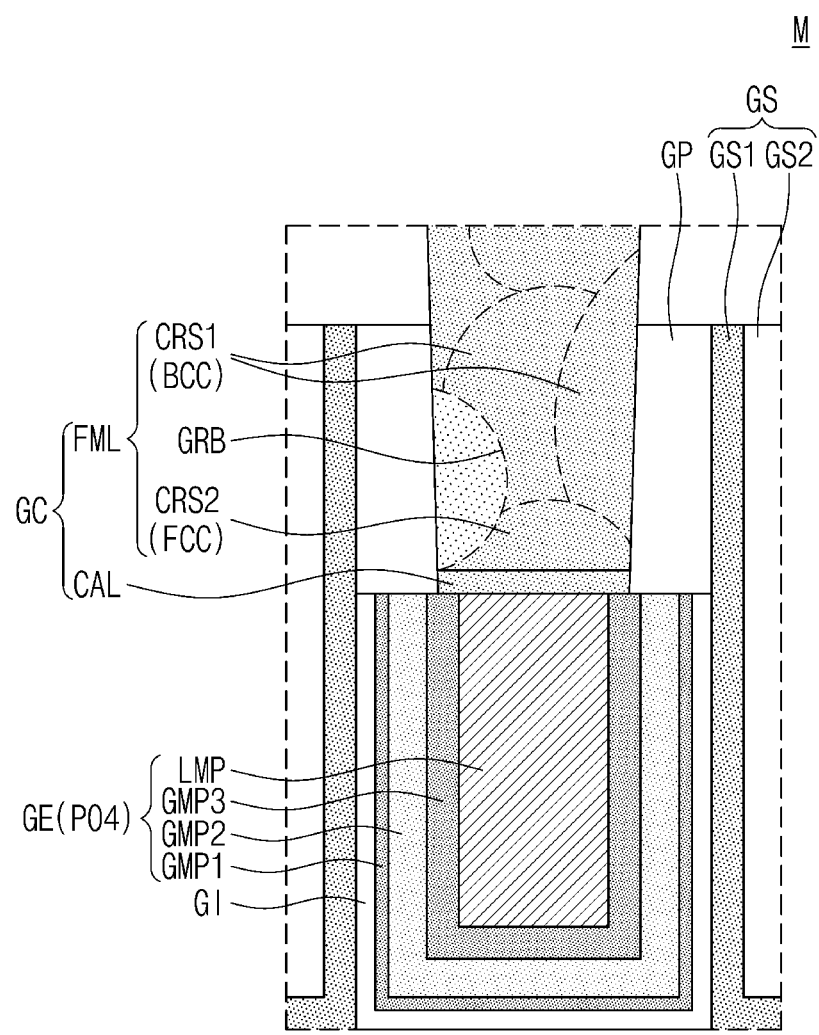
Figure 18C:
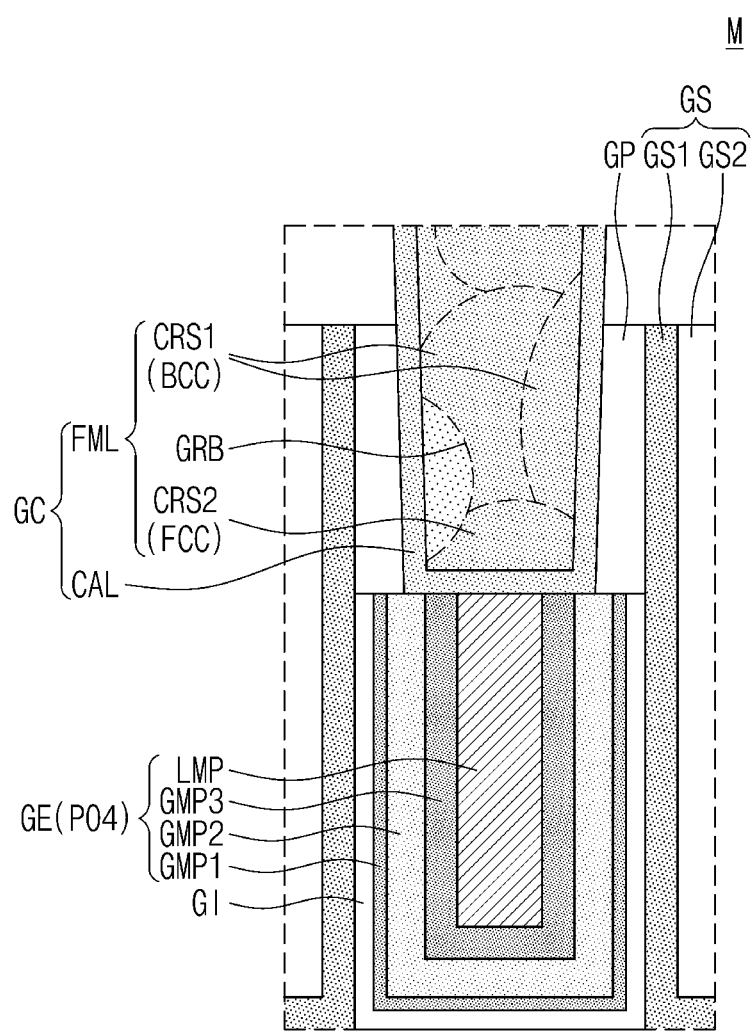

FIGS. 18A, 18B, and 18C are respective, enlarged cross-section views further illustrating the region 'M' indicated in FIG. 5A. Referring to FIGS. 6, 18A, and 18B, the gate electrode GE may be configured such that layers included in the gate electrode GE are changed based on a gate length or a width in the second direction D2 of the gate electrode GE. For example, as shown in FIG. 18A, the gate electrode GE may not include the fill metal pattern LMP therein. When a relatively long gate length is provided as illustrated in FIG. 18B, the fill metal pattern LMP in the gate electrode GE may have an increased volume ratio (e.g., more than about 50%).

When the capping layer CAL is omitted from the gate contact GC, a crystal structure (BCC/FCC) and average grain size in the gate contact GC may be changed based on a variation in layers included in the gate electrode GE. (See, e.g., FIGS. 6, 18A, and 18B). This may result from the fact that when a metal layer is deposited, the second metal precursor containing an oxygen atom is largely affected by physical characteristics of a layer that underlies the metal layer.

In some embodiments, the capping layer CAL may be formed using the first metal precursor devoid of oxygen atom, and the metal layer FML may be formed on the capping layer CAL. Therefore, a crystal structure and average grain size of the metal layer FML may be affected by only the capping layer CAL, and not by variation in constituent layers of the gate electrode GE. (See, e.g., FIGS. 6, 18A, and 18B). As a result, irrespective of constituent layers, the gate contact GC in some embodiments may have a uniform crystal structure and a regular average grain size.

Referring to FIG. 18C, the capping layer CAL may surround the metal layer FML. As shown in FIG. 6, the capping layer CAL may be provided only at an interface between the gate contact GC and the gate electrode GE, or as shown in FIG. 18C, the capping layer CAL may be provided to entirely constitute a surface of the gate contact GC.

FIGS. 19A, 19B, 19C, and 19D are cross-sectional views respectively taken along lines A-A', B-B', C-C', and D-D' of FIG. 4, and may be compared with the embodiments illustrated in FIGS. 4, 5A, 5B, 5C and 5D.

Referring to FIGS. 4, 19A, 19B, 19C and 19D, the device isolation layer ST may define a first active pattern AP1 and a second active pattern AP2 on an upper portion of the substrate 100. The first active pattern AP1 may be defined on each of the first PMOSFET region PR1 and the second PMOSFET region PR2, and the second active pattern AP2 may be defined on each of the first NMOSFET region NR1 and the second NMOSFET region NR2.

The device isolation layers ST may cover a lower sidewall of each of the first and second active patterns AP1 and AP2. An upper portion of each of the first and second active patterns AP1 and AP2 may protrude upwardly from the device isolation layer ST. (See, e.g., FIG. 19D).

The first active pattern AP1 may include first source/drain patterns SD1 on an upper portion thereof and a first channel pattern CH1 between the first source/drain patterns SD1. The second active pattern AP2 may include second source/drain patterns SD2 on an upper portion thereof and a second channel pattern CH2 between the second source/drain patterns SD2.

Figure 19A:
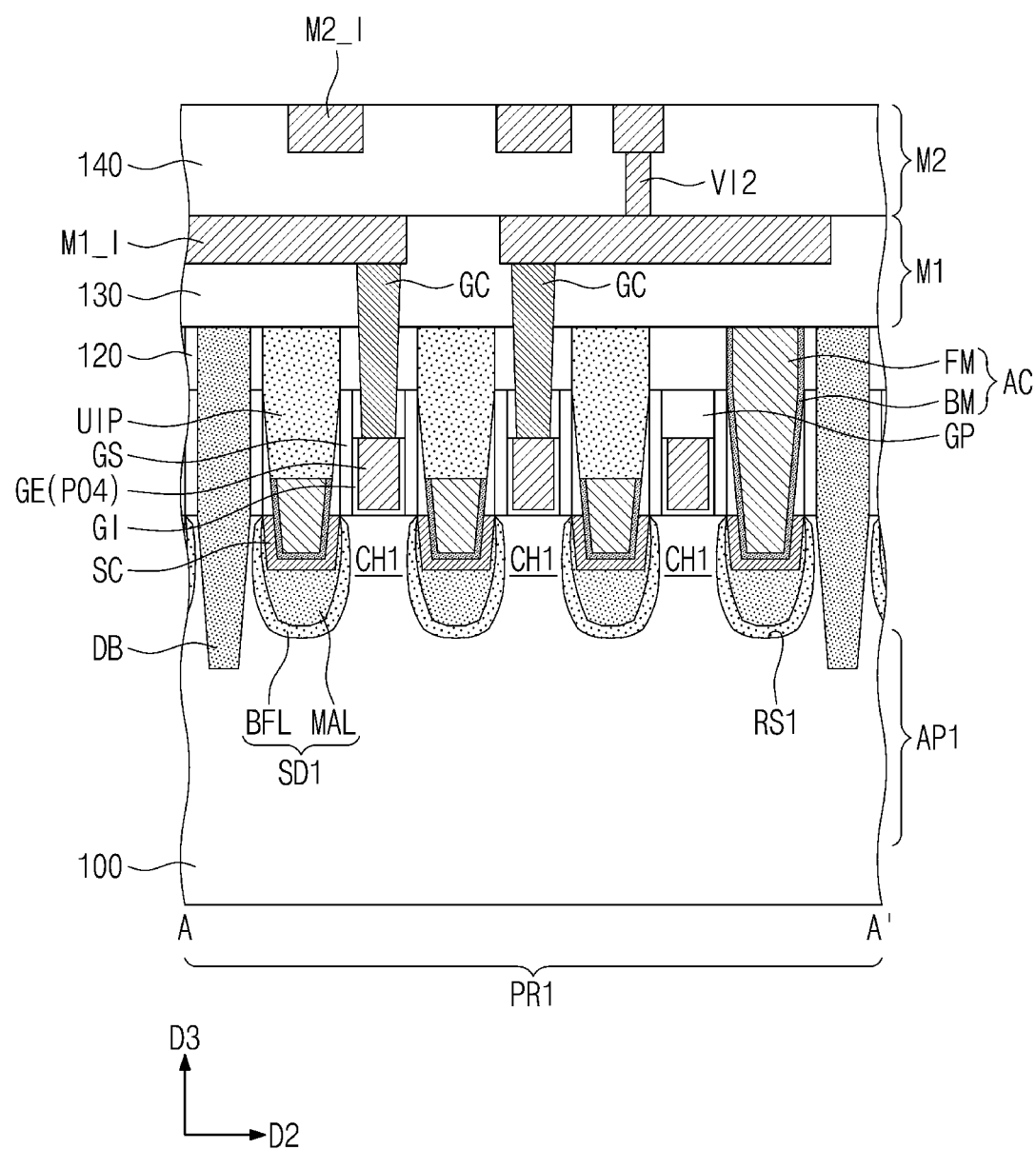
FIGS. 19A, 19B, 19C, and 19D are cross-sectional views taken along lines A-A', B-B', C-C', and D-D' of FIG. 4.
Figure 19B:
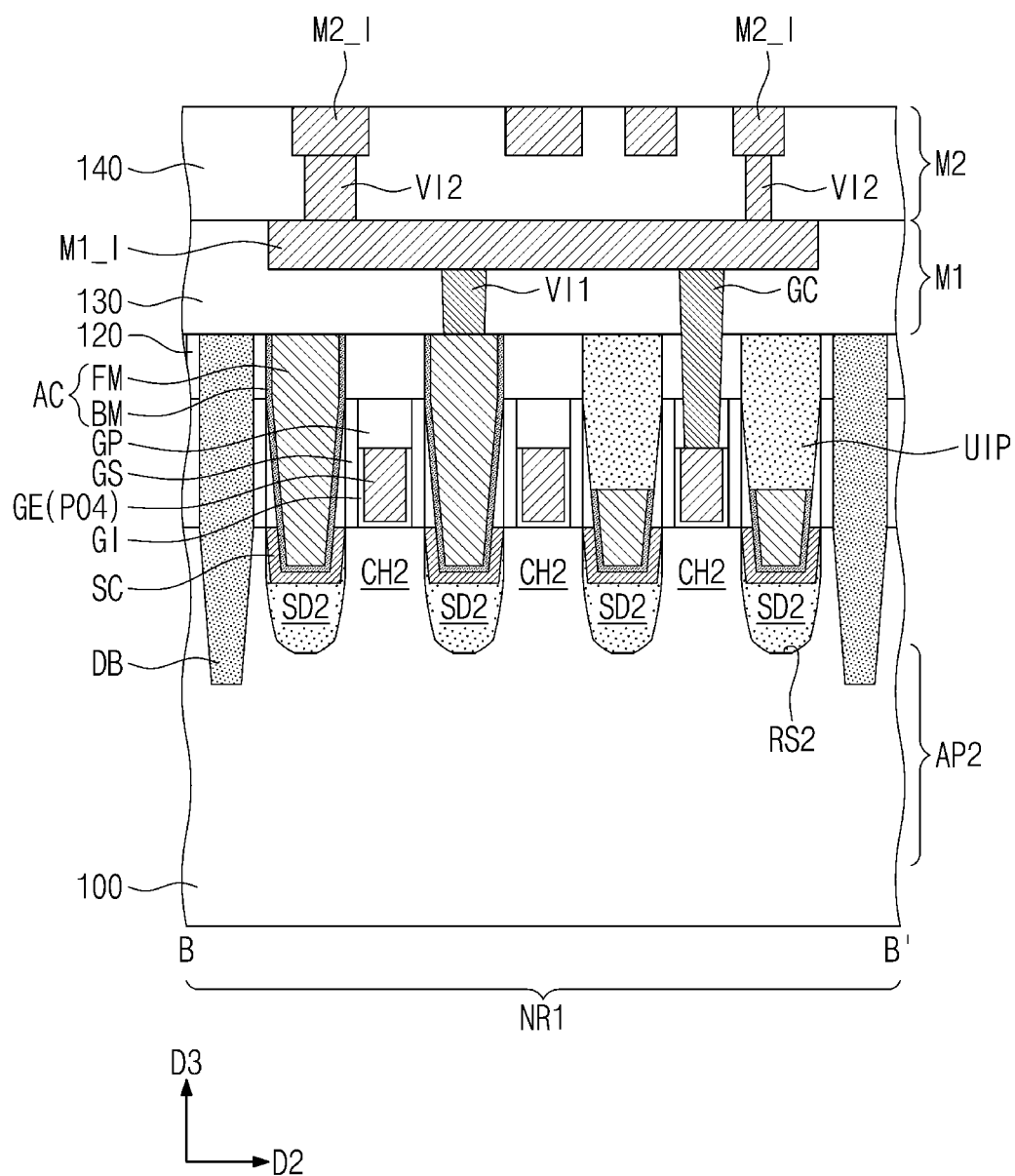
Figure 19C:
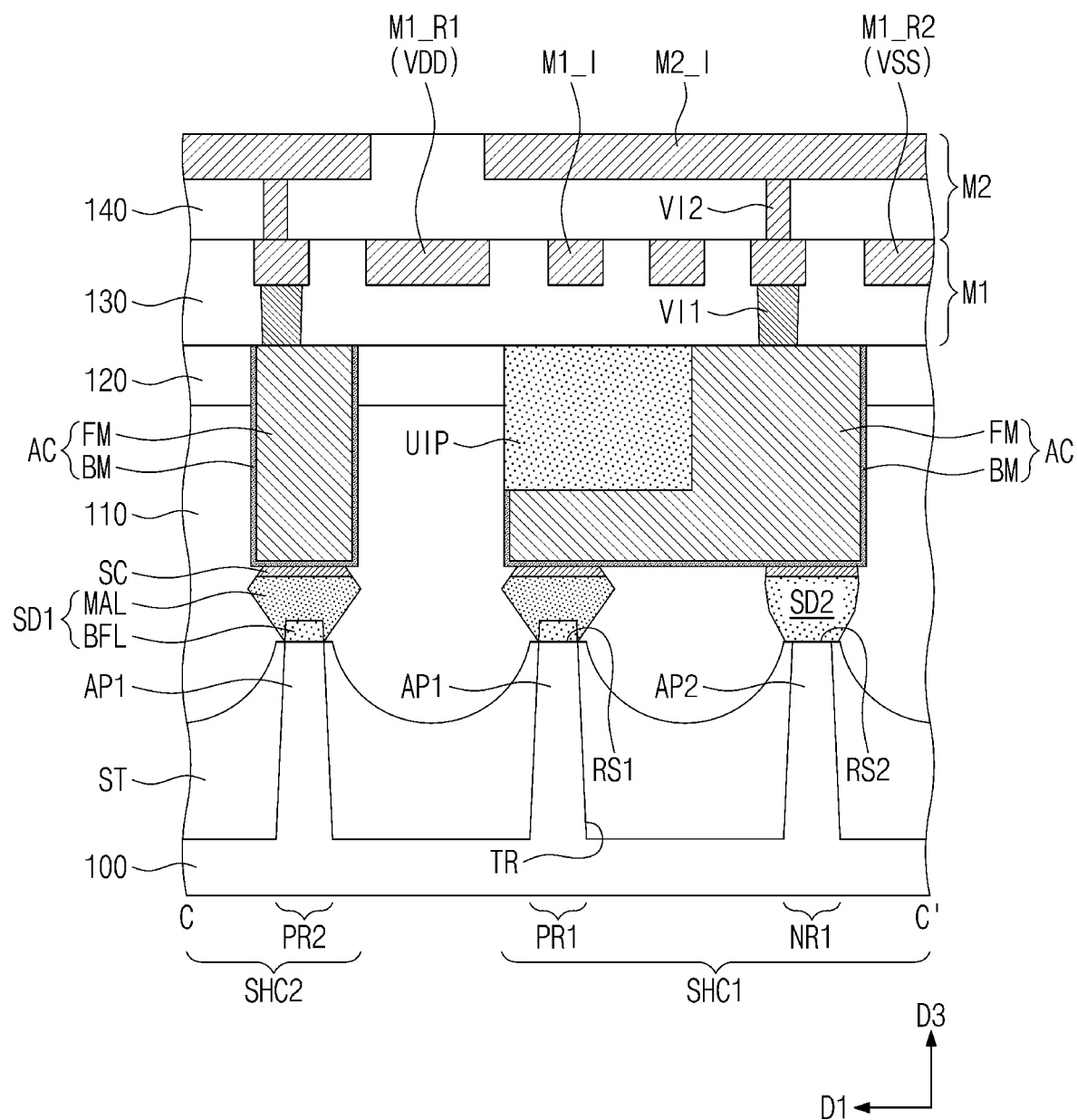
Figure 19D:
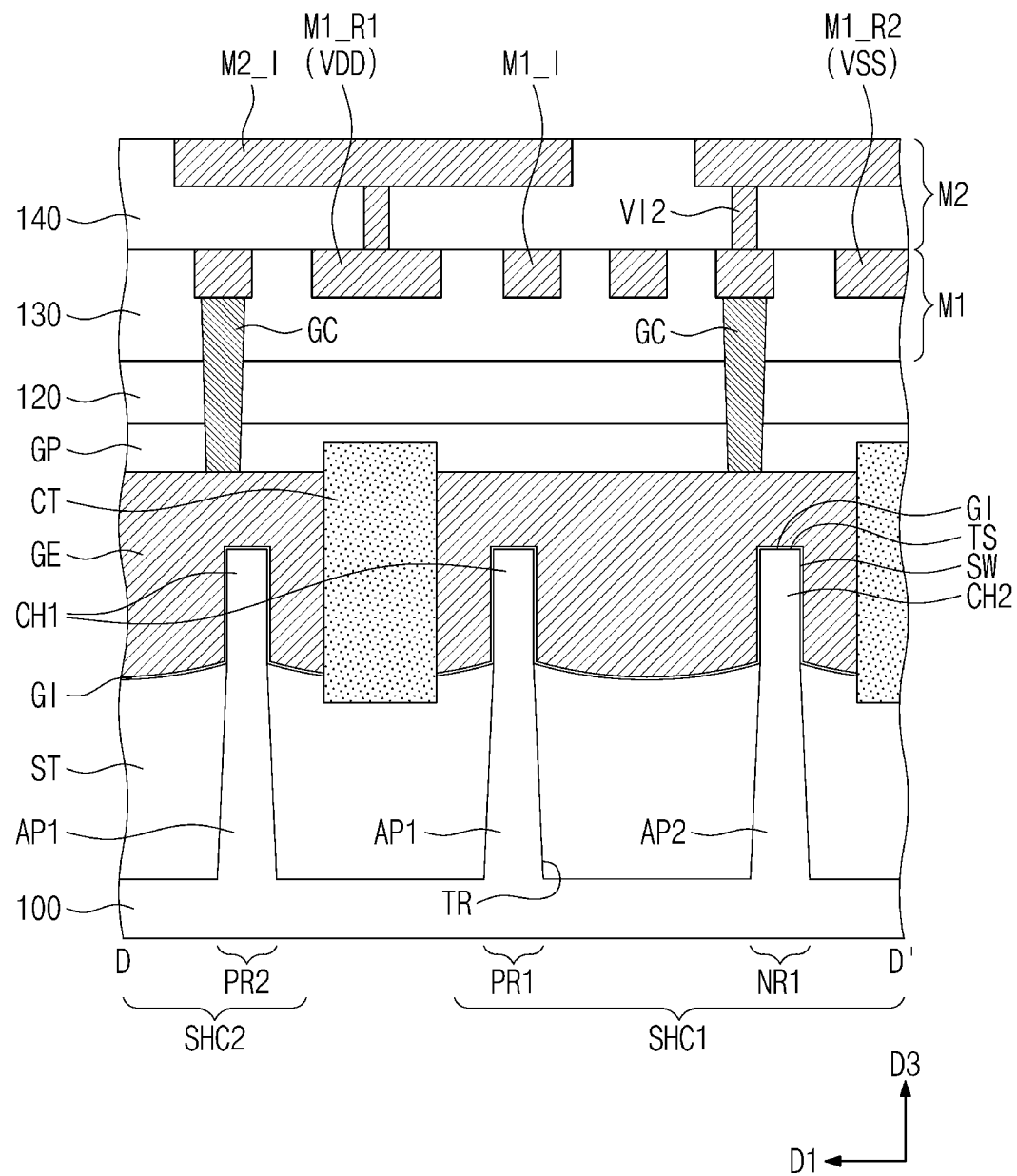

Referring to FIG. 19D, each of the first and second channel patterns CH1 and CH2 may not include any of the first, second, and third semiconductor patterns SP1, SP2, and SP3 previously described with reference to FIGS. 5A, 5B, 5C and 5D. Each of the first and second channel patterns CH1 and CH2 may have one semiconductor pillar shape that protrudes upwardly from the device isolation layer ST. (See, e.g., FIG. 19D).

A gate electrode GE may be provided on a top surface TS and opposing sidewalls SW of each of the first and second channel patterns CH1 and CH2. In this sense, a transistor according to some embodiments may be a three-dimensional field effect transistor (e.g., FinFET) in which the gate electrode GE three-dimensionally surrounds the first and second channel patterns CH1 and CH2.

A first interlayer dielectric layer 110 and a second interlayer dielectric layer 120 may be provided on an entire surface of the substrate 100. Active contacts AC may be provided to penetrate the first and second interlayer dielectric layers 110 and 120 to come into connection with the first and second source/drain patterns SD1 and SD2. A first via VI1 may be provided on the active contact AC. A gate contact GC may be provided to penetrate the second interlayer dielectric layer 120 and the gate capping pattern GP to come into connection with the gate electrode GE. Here, the active contact AC, the gate contact GC, and the first via VI1 may be substantially the same as analogous elements previously described with reference to FIGS. 4, 5A, 5B, 5C, 5D, and 6.

A third interlayer dielectric layer 130 may be provided on the second interlayer dielectric layer 120. A first metal layer M1 may be provided in the third interlayer dielectric layer 130. A second metal layer M2 may be provided in the fourth interlayer dielectric layer 140. The first metal layer M1 and the second metal layer M2 may be substantially the same as analogous elements previously described with reference to FIGS. 4, 5A, 5B, 5C and 5D.

A gate contact of a semiconductor device according to embodiments of the inventive concept may be formed with a double-layer structure using a first precursor and a second precursor having different oxygen fractions. A capping layer may be formed using the first precursor devoid of oxygen, and thus the formation of oxidation between the gate contact and a gate electrode may be prevented. A metal layer may be formed using a second precursor containing oxygen, and thus process efficiency may increase. As a result, the gate contact may have an extremely low resistivity, and semiconductor devices incorporating the gate contact may exhibit improved electrical properties.

Although certain embodiments of inventive concept have been described with reference to accompanying figures, those skilled in the art will appreciate that various changes in form and detail may be made therein without departing from the scope of inventive concept, as defined by the accompanying claims.

What is claimed is:

1. A semiconductor device, comprising:
   a substrate including an active pattern;
   a channel pattern and a source/drain pattern on the active pattern,
   wherein the channel pattern is connected to the source/drain pattern;
   a gate electrode on the channel pattern; and
   a gate contact connected to a top surface of the gate electrode, wherein the gate contact includes a capping layer directly contacting the top surface of the gate electrode and a metal layer on the capping layer,
   wherein the capping layer and the metal layer include the same metal,
   a concentration of oxygen in the metal layer ranges from between about 2 at % to about 10 at %, and
   a maximum concentration of oxygen in the capping layer ranges from between about 15 at % to about 30 at %.

2. The semiconductor device of claim 1, wherein the metal layer includes a first crystal region having a body centered cubic structure and a second crystal region having a face centered cubic structure, and
   a ratio of the first crystal region in the metal layer is greater than a ratio of the second crystal region in the metal layer.

3. The semiconductor device of claim 2, wherein the metal layer further includes a grain boundary between the first crystal region and the second crystal region.

4. The semiconductor device of claim 1, wherein the capping layer and the metal layer include at least one of molybdenum, tungsten, ruthenium, cobalt, and vanadium.

5. The semiconductor device of claim 1, wherein an average grain size of the metal layer ranges from between about 100 Å to about 500 Å.

6. The semiconductor device of claim 1, wherein a resistivity of the metal layer ranges from between about 10 µΩcm to about 18µΩcm.

7. The semiconductor device of claim 1, wherein the gate contact includes no barrier metal.

8. The semiconductor device of claim 1, further comprising:
   an active contact electrically connected to the source/drain pattern;
   a via on the active contact;
   a first wiring line on the gate contact; and
   a second wiring line on the via,
   wherein the via and the gate contact include the same metal.

9. The semiconductor device of claim 1, wherein the capping layer is formed using a first metal precursor devoid of an oxygen atom, and
   the metal layer is formed using a second metal precursor including an oxygen atom.

10. The semiconductor device of claim 1, wherein the active pattern includes stacked nano-sheets,
    the gate electrode includes an inner electrode between the nano-sheets and an outer electrode on the nano-sheets, and
    the gate contact is connected to a top surface of the outer electrode.

11. A semiconductor device, comprising:
    a substrate including an active pattern;
    a channel pattern and a source/drain pattern on the active pattern,
    wherein the channel pattern is connected to the source/drain pattern;
    a gate electrode on the channel pattern; and
    a gate contact connected to a top surface of the gate electrode,
    wherein a concentration of oxygen at an interface between the gate contact and the gate electrode ranges from between about 15 at % to about 30 at %, and
    an average grain size of the gate contact ranges from between about 100 Å to about 500 Å.

12. The semiconductor device of claim 11, wherein
    the gate contact includes a first crystal region having a body centered cubic structure and a second crystal region having a face centered cubic structure, and
    a ratio of the first crystal region in the gate contact is greater than a ratio of the second crystal region in the gate contact.

13. The semiconductor device of claim 11, wherein the gate contact includes at least one of molybdenum, tungsten, ruthenium, cobalt, and vanadium.

14. The semiconductor device of claim 11, wherein the gate contact includes no barrier metal.

15. The semiconductor device of claim 11, further comprising:
    an active contact electrically connected to the source/drain pattern;
    a via on the active contact;
    a first wiring line on the gate contact; and
    a second wiring line on the via,
    wherein the via and the gate contact include the same metal.

16. A semiconductor device, comprising:
    a substrate including a PMOSFET region and an NMOSFET region;
    a first active pattern on the PMOSFET region and a second active pattern on the NMOSFET region;
    a first channel pattern and a first source/drain pattern on the first active pattern;
    a second channel pattern and a second source/drain pattern on the second active pattern;
    a gate electrode on the first channel pattern and the second channel pattern;
    a gate dielectric layer between the gate electrode and the first channel pattern and the second channel pattern;
    a gate spacer on a sidewall of the gate electrode;
    a gate capping pattern on a top surface of the gate electrode;
    a gate cutting pattern that penetrates the gate electrode;
    an interlayer dielectric layer on the gate capping pattern and the gate cutting pattern;
    a gate contact that penetrates the interlayer dielectric layer and the gate capping pattern and is connected to the top surface of the gate electrode;
    a first metal layer on the interlayer dielectric layer, the first metal layer including a power line that vertically overlaps the gate cutting pattern and a first wiring line connected to the gate contact; and
    a second metal layer on the first metal layer, wherein the second metal layer includes second wiring lines electrically connected to the first metal layer, the gate contact includes molybdenum, and an average grain size of the molybdenum in the gate contact ranges from between about 100 Å to about 500 Å.

17. The semiconductor device of claim 16, wherein a concentration of oxygen at an interface between the gate contact and the gate electrode ranges from between about 15 at % to about 30 at %.

18. The semiconductor device of claim 16, wherein the gate contact includes a first crystal region having a body centered cubic structure and a second crystal region having a face centered cubic structure, and a ratio of the first crystal region in the gate contact is greater than a ratio of the second crystal region in the gate contact.

19. The semiconductor device of claim 16, further comprising:

an active contact that penetrates the interlayer dielectric layer and is electrically connected to the first and second source/drain patterns;

metal-semiconductor compound layers between the active contact and the first and second source/drain patterns; and a via including molybdenum on the active contact, wherein the first metal layer further includes a second wiring line connected to the via.

20. The semiconductor device of claim 16, wherein the gate contact includes no barrier metal, and the molybdenum of the gate contact directly contacts the top surface of the gate electrode.

* * * * *